(12) United States Patent
Jariwala et al.

(10) Patent No.: US 12,740,102 B2
(45) Date of Patent: Sep. 15, 2026

(54) POST CMOS COMPATIBLE FERROELECTRIC FIELD EFFECT TRANSISTOR WITH AlScN DIELECTRIC AND 2D MATERIAL CHANNEL

(71) Applicant: The Trustees of the University of Pennsylvania, Philadelphia, PA (US)

(72) Inventors: Deep Jariwala, Philadelphia, PA (US); Roy H Olsson, III, Philadelphia, PA (US); Xiwen Liu, Philadelphia, PA (US); Eric Andrew Stach, Swarthmore, PA (US); Kwan-Ho Kim, Philadelphia, PA (US)

(73) Assignee: The Trustees of the University of Pennsylvania, Philadelphia, PA (US)

( * ) Notice: Subject to any disclaimer, the term of this patent is extended or adjusted under 35 U.S.C. 154(b) by 0 days.

(21) Appl. No.: 17/354,256

(22) Filed: Jun. 22, 2021

(65) Prior Publication Data

US 2021/0399138 A1 Dec. 23, 2021

Related U.S. Application Data

(60) Provisional application No. 63/042,117, filed on Jun. 22, 2020.

(51) Int. Cl.
*H10D 30/69* (2025.01)
*H10D 48/36* (2025.01)
(Continued)

(52) U.S. Cl.
CPC ......... *H10D 30/701* (2025.01); *H10D 48/362* (2025.01); *H10D 62/80* (2025.01);
(Continued)

(58) Field of Classification Search
CPC ..... H10D 30/47; H10D 64/033; H10D 64/689
See application file for complete search history.

(56) References Cited

U.S. PATENT DOCUMENTS 6,072,454 A * 6/2000 Nakai .................. G09G 3/2011 345/97
9,269,785 B2 2/2016 Mueller et al.
(Continued)

FOREIGN PATENT DOCUMENTS

EP 1096555 A2 * 5/2001 ....... H01L 21/02197
EP 3340323 A1 * 6/2018 ............. H01L 27/20
WO 2020/025426 A1 2/2020

OTHER PUBLICATIONS

Chang et al., "Guest Editorial: IEEE Transactions on Computers Special Section on Emerging NonVolatile Memory Technologies: From Devices to Architectures and Systems," IEEE TC, vol. 68, pp. 1111-1113, (2019).
(Continued)

*Primary Examiner* — Vincent Wall
(74) *Attorney, Agent, or Firm* — BakerHostetler

(57) ABSTRACT

Provided are ferroelectric field effect transistor (FeFET) based memory devices. These devices include aluminum scandium nitride (AlScN) as a ferroelectric dielectric and 2D chalcogenide semiconductors as a semiconductor channel in the transistor. The disclosed materials, devices and fabrication processes involved are compatible with back end of the line (BEOL) processing of a silicon based microchip and also compatible with silicon microprocessor fabrication.

23 Claims, 40 Drawing Sheets
(39 of 40 Drawing Sheet(s) Filed in Color)

(51) Int. Cl.

| | |
|---|---|
| ***H10D 62/80*** | (2025.01) |
| ***H10D 64/01*** | (2025.01) |
| ***H10D 64/62*** | (2025.01) |
| ***H10D 64/68*** | (2025.01) |
| ***H10D 99/00*** | (2025.01) |
| ***H10P 14/20*** | (2026.01) |

(52) U.S. Cl.

CPC ........... *H10D 64/033* (2025.01); *H10D 64/62* (2025.01); *H10D 64/689* (2025.01); *H10D 99/00* (2025.01); *H10P 14/3436* (2026.01)

(56) References Cited

U.S. PATENT DOCUMENTS

| | | | | |
|---|---|---|---|---|
| 10,163,932 | B1 | 12/2018 | Sinitskii et al. | |
| 10,211,312 | B2 | 2/2019 | Van Houdt et al. | |
| 11,054,673 | B2* | 7/2021 | Soltani | H01S 5/125 |
| 2007/0287237 | A1* | 12/2007 | Rockenberger | H01L 29/4908 257/E29.147 |
| 2009/0189152 | A1* | 7/2009 | Cho | B82Y 10/00 257/295 |
| 2014/0197459 | A1* | 7/2014 | Kis | H01L 29/40111 257/194 |
| 2014/0264515 | A1* | 9/2014 | Fabiano | H10K 10/471 257/295 |
| 2014/0319452 | A1* | 10/2014 | Seabaugh | G11C 13/0016 257/9 |
| 2020/0105940 | A1 | 4/2020 | Majhi et al. | |
| 2020/0235110 | A1* | 7/2020 | Morris | H01L 29/78642 |
| 2020/0388685 | A1* | 12/2020 | Sharma | H01L 29/66795 |
| 2021/0193811 | A1* | 6/2021 | Moon | H01L 21/02181 |
| 2021/0391471 | A1* | 12/2021 | Vellianitis | H10B 51/30 |

OTHER PUBLICATIONS

Fichtner et al., "AlScN: A III-V semiconductor based ferroelectric," J. Appl. Phys., No. 125, pp. 114103, (2019).

Jerry et al., "Ferroelectric FET analog synapse for acceleration of deep neural network training," IEEE IEDM, pp. 6.2.1, (2017).

Lipatov et al., "Optoelectrical Molybdenum Disulfide (MoS2)—Ferroelectric Memories," ACS Nano., vol. 9, pp. 8089-8098, (2015).

Wang et al., "Ultrasensitive and Broadband MoS2 Photodetector Driven by Ferroelectrics," Adv. Mater., vol. 27, pp. 6575-6581, (2015).

Yap et al., "Ferroelectric transistors with monolayer molybdenum disulfide and ultra-thin aluminum-doped hafnium oxide," Appl. Phys. Lett., vol. 111, pp. 013103, (2017).

* cited by examiner

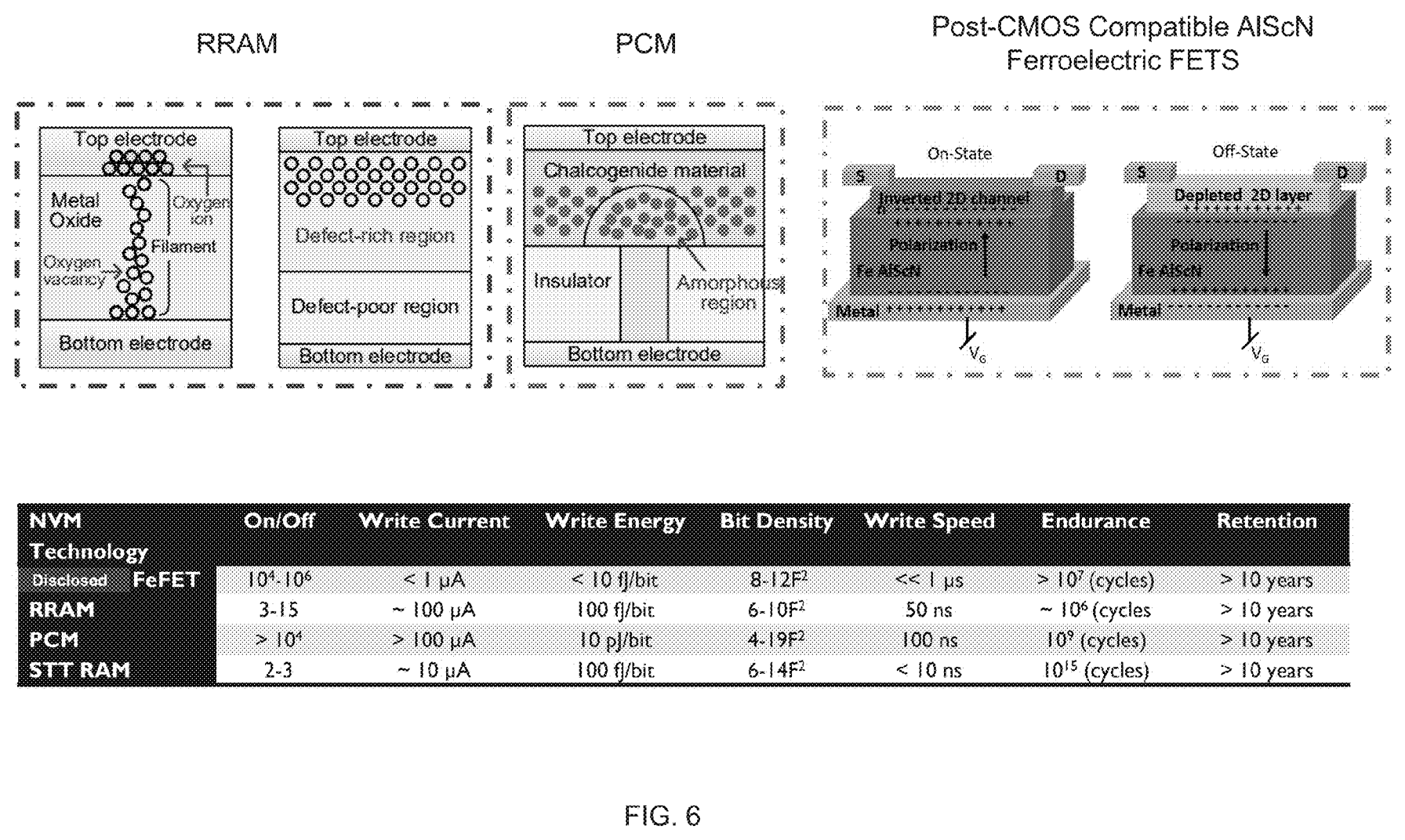

RRAM

Top electrode
Metal Oxide
Oxygen ion
Filament
Oxygen vacancy
Bottom electrode

Top electrode
Defect-rich region
Defect-poor region
Bottom electrode

PCM

Top electrode
Chalcogenide material
Insulator
Amorphous region
Bottom electrode

Post-CMOS Compatible AlScN Ferroelectric FETS

On-State
S
D
Inverted 2D channel
Polarization
Fe AlScN
Metal
$V_G$

Off-State
S
D
Depleted 2D layer
Polarization
Fe AlScN
Metal
$V_G$

| NVM Technology | On/Off | Write Current | Write Energy | Bit Density | Write Speed | Endurance | Retention |
|---|---|---|---|---|---|---|---|
| Disclosed FeFET | $10^4$-$10^6$ | < 1 μA | < 10 fJ/bit | 8-12F² | << 1 μs | > $10^7$ (cycles) | > 10 years |
| RRAM | 3-15 | ~ 100 μA | 100 fJ/bit | 6-10F² | 50 ns | ~ $10^6$ (cycles | > 10 years |
| PCM | > $10^4$ | > 100 μA | 10 pJ/bit | 4-19F² | 100 ns | $10^9$ (cycles) | > 10 years |
| STT RAM | 2-3 | ~ 10 μA | 100 fJ/bit | 6-14F² | < 10 ns | $10^{15}$ (cycles) | > 10 years |

FIG. 6

AlScN P-E loop:
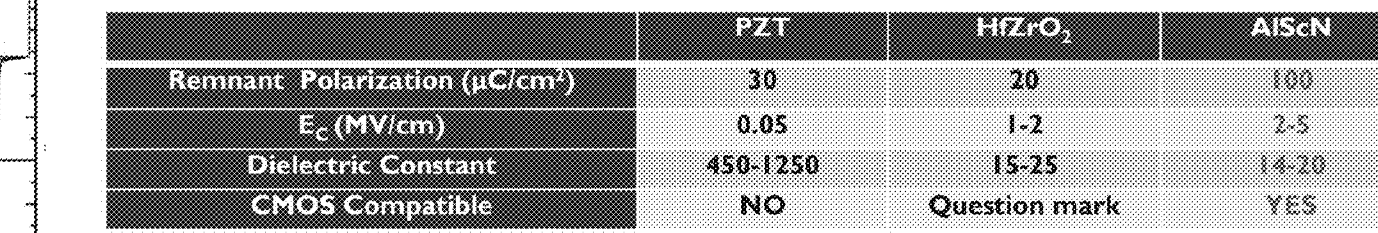
| | PZT | $HfZrO_2$ | AlScN |
|---|---|---|---|
| Remnant Polarization ($\mu C/cm^2$) | 30 | 20 | 100 |
| $E_C$ (MV/cm) | 0.05 | 1-2 | 2-5 |
| Dielectric Constant | 450-1250 | 15-25 | 14-20 |
| CMOS Compatible | NO | Question mark | YES |
Depolarization field:
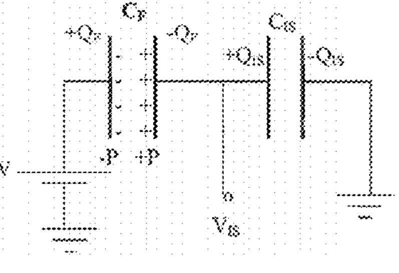
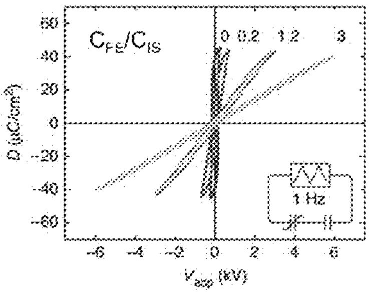
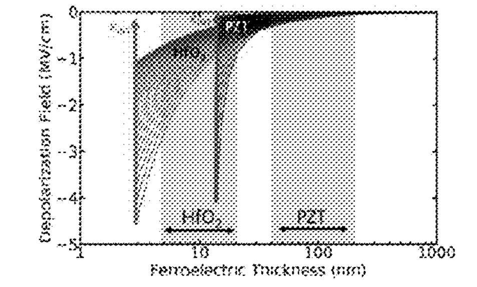
Preferred metrics:
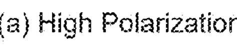
(a) High Polarization
(b) Large coercive field
(c) “Square loop”
(d) Moderate dielectric constant
FIG. 7

Post-CMOS Compatible
AlScN Ferroelectric FETS

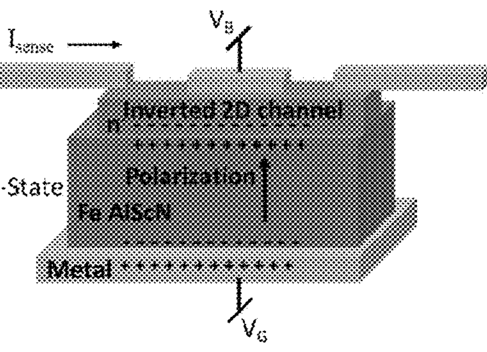

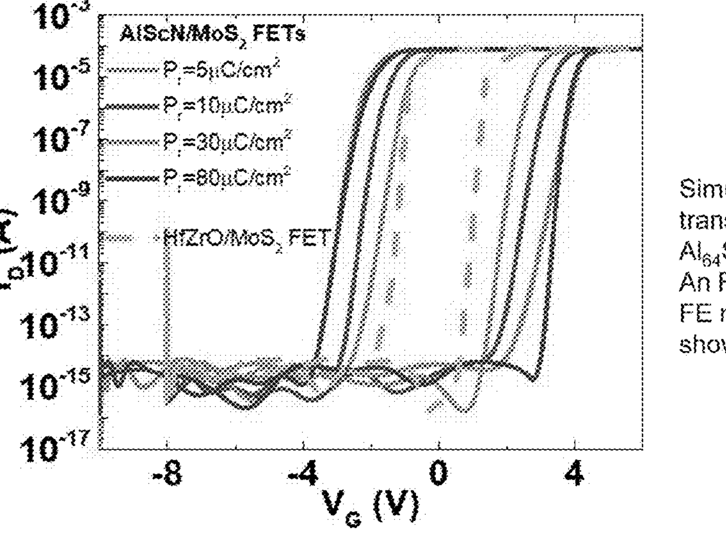

Simulated semi-log transfer characteristics of $Al_{64}Sc_{36}N/MoS_2$ FeFET. An FeFET utilizing HfZrO FE material is also shown.

2D Semiconductor on AlScN FeFET

- Leverages high coercive field found in AlScN for large memory window
- Large on-off ratio critical to memory
- Mo and W chalcogenides with thickness control at monolayer level
- 2D semiconductor is fully depleted, eliminating depolarization capacitor formed in partially depleted FeFETs
- AlScN can be grown on metals with hexagonal symmetry rather than the semiconductor, eliminating "dead layer" and resulting depolarization field
- The interfaces are critical

FeFET for CMOS BEOL Integration

- All processes proven commercially at 8 inch nodes
- All materials and process conditions (i.e. temperature) compatible with CMOS BEOL integration
- Explores both CVD and wafer scale exfoliated 2-D semiconductors

FIG. 8

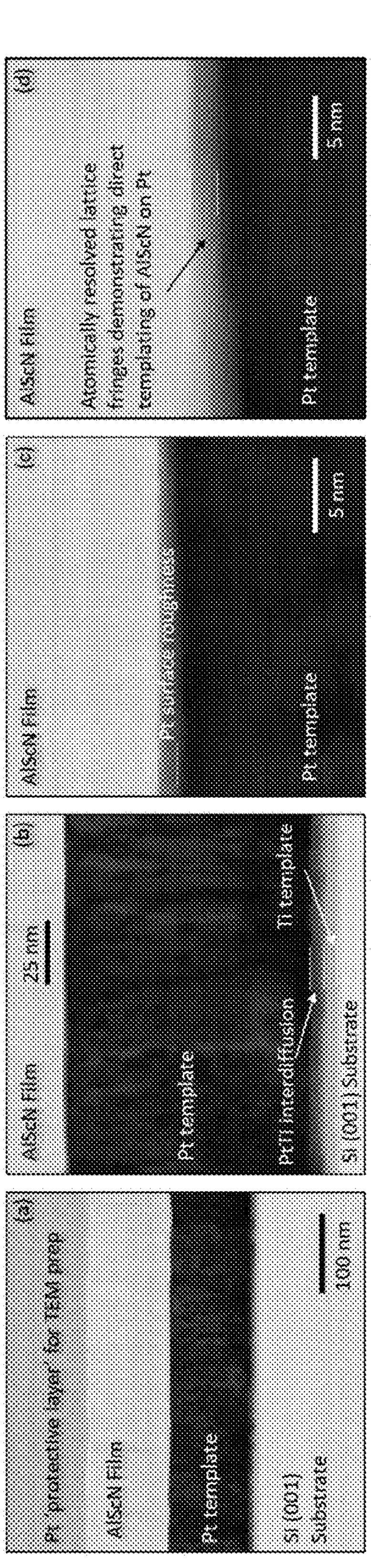
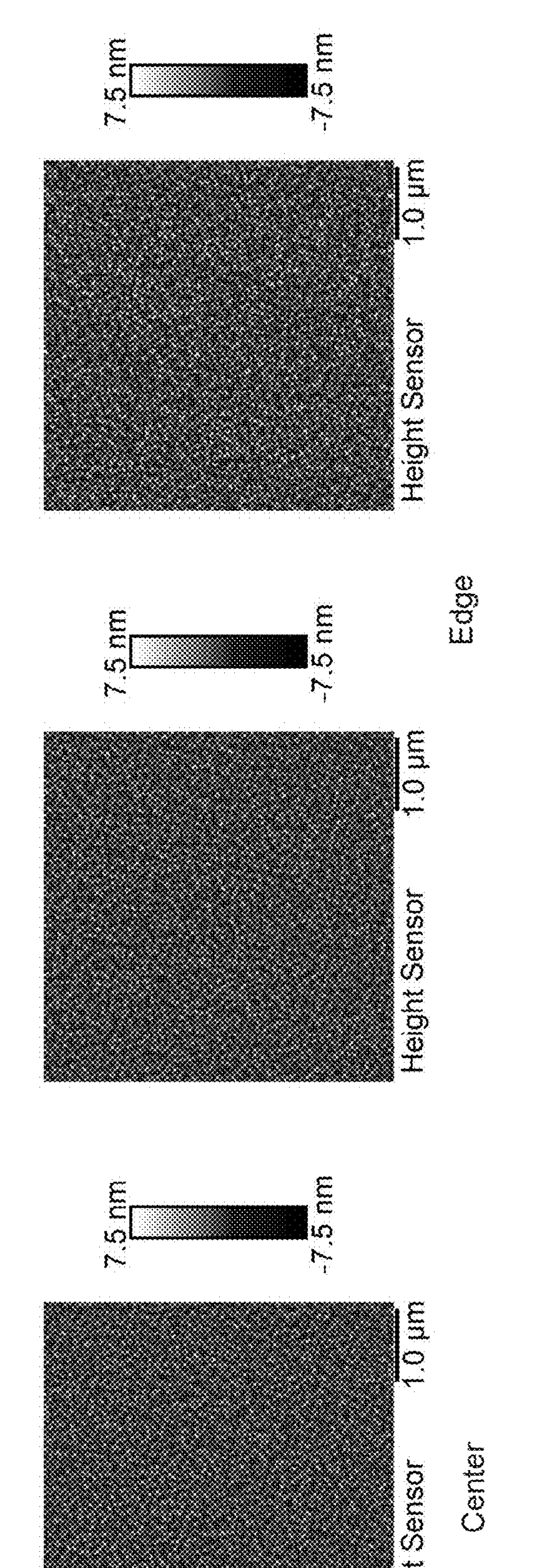
FIG. 9

| Reference | Memory window / ferroelectric thickness | On / Off ratio |
|---|---|---|
| Zr-doped $HfO_2$ | MV ~ 0.5 V / 10 nm | $10^4$ |
| Al-doped $HfO_2$ | MV ~ 2 V / 16 nm | 10 |
| P(VDF-TrFE) | MV ~ 25 V / 300 nm | $10^4$ |
| PZT | MV ~ 5 V/ 100 nm | $10^3$ |
| This work | MV ~ 40 V / 100 nm | $10^6$ |

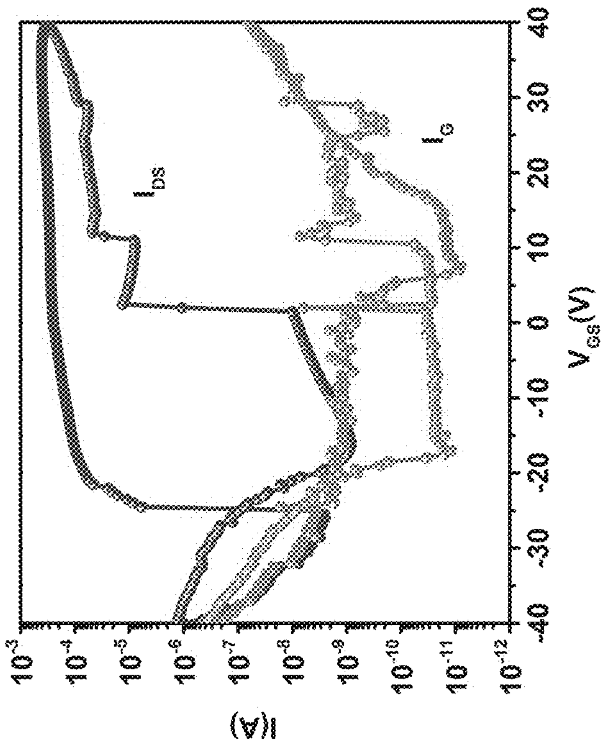
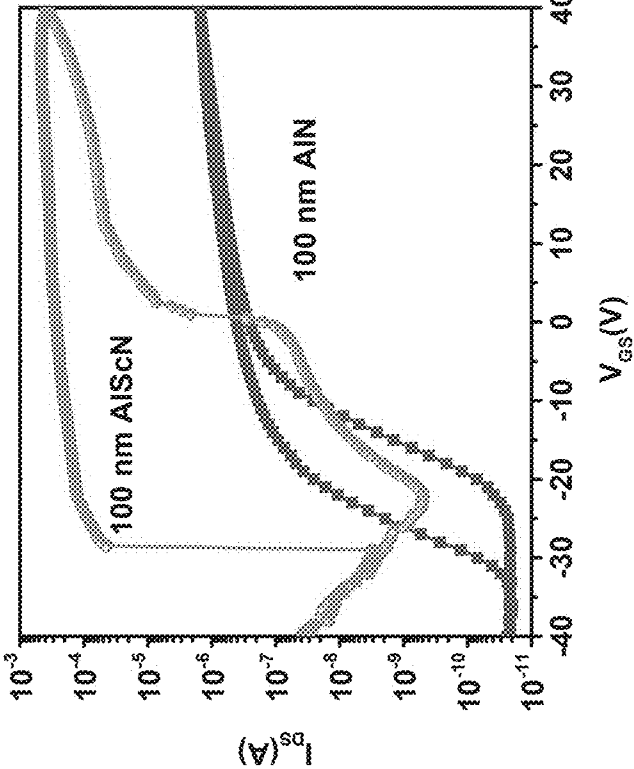
FIG. 13

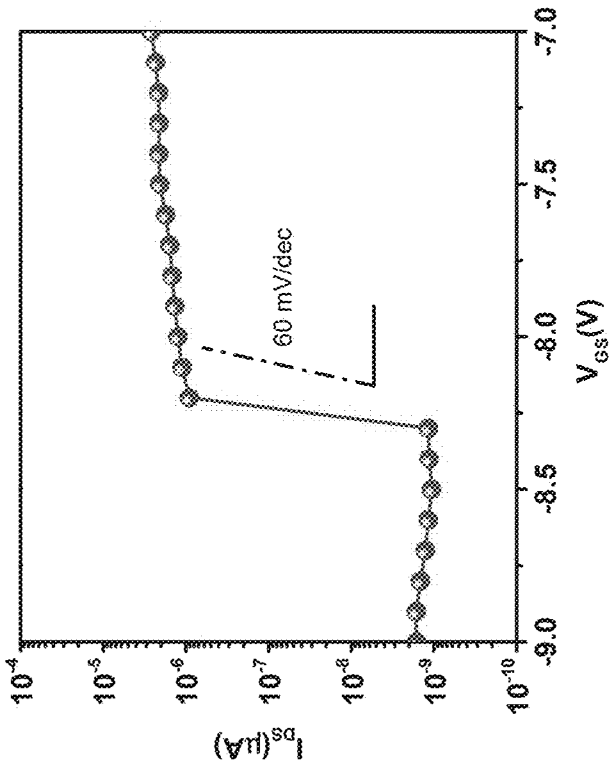
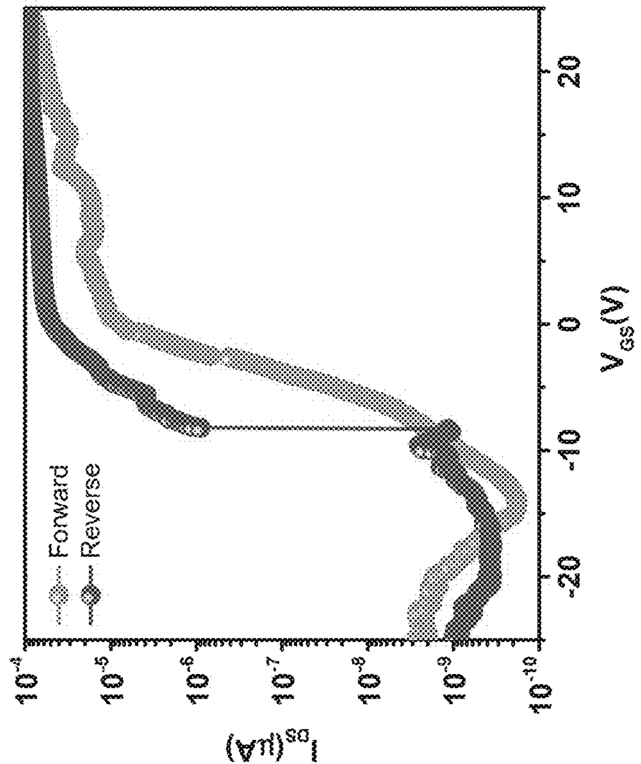
FIG. 14 dP = P* - P^ = 2P (μC/cm²)
Applied Voltage (V)
Pulse width = 100 ms
Switched Polarization (μC/cm²)
Applied voltage (V)
dP
-dP, Pulse width = 10 μs Drain Current (A)
Gate Voltage (V)
V_DS = 0.5 V
V_DS = 1 V
Memory window
Gate current Drain Current (A)
Gate Voltage (V)
AlScN
PZT
HZO Drain Current (mA)
Drain Voltage (V)
V_GS from -30 V to 30 V Drain Current (A)
Cycle Resistance (Ohm)
Time (s)

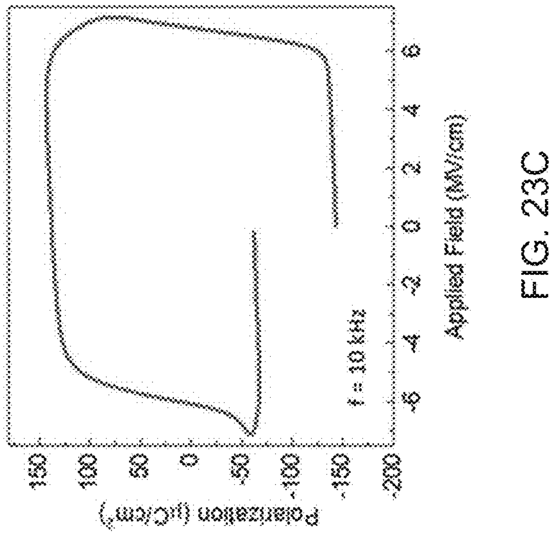
FIG. 23C
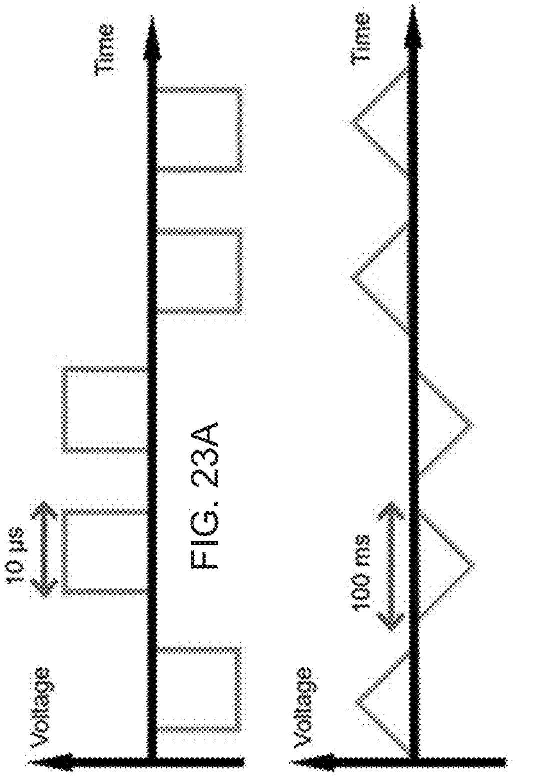
FIG. 23A
FIG. 23B

Threshold voltage (V)

Oxide thickness (nm)

Low threshold voltage

High threshold voltage

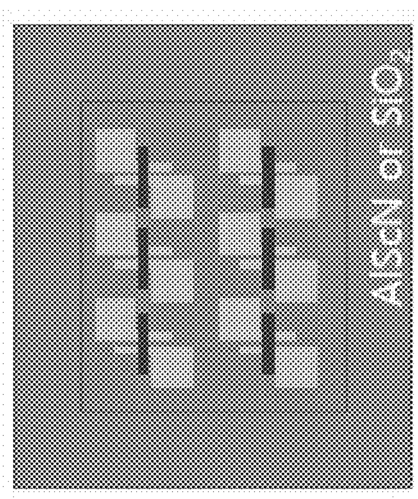
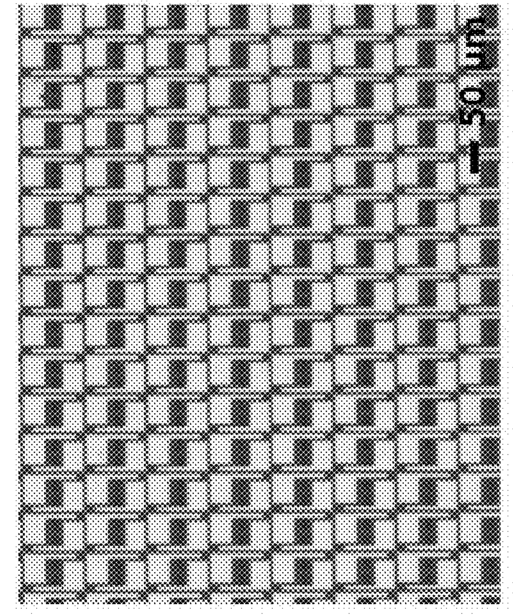
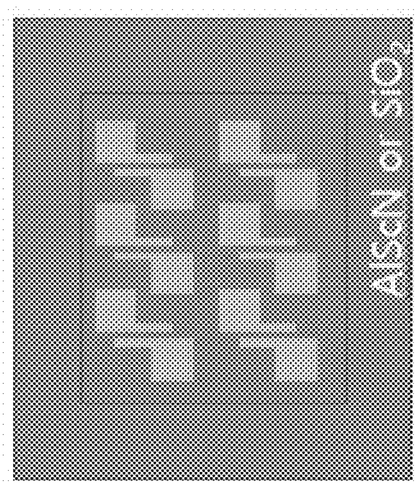
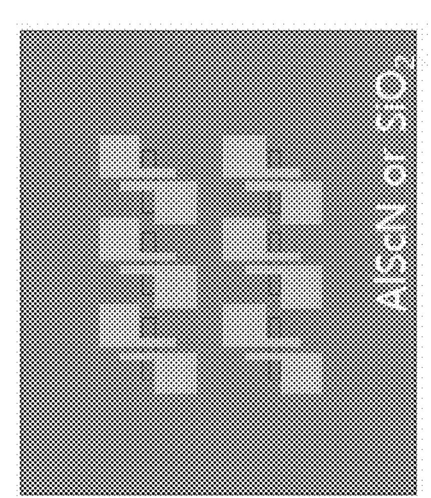
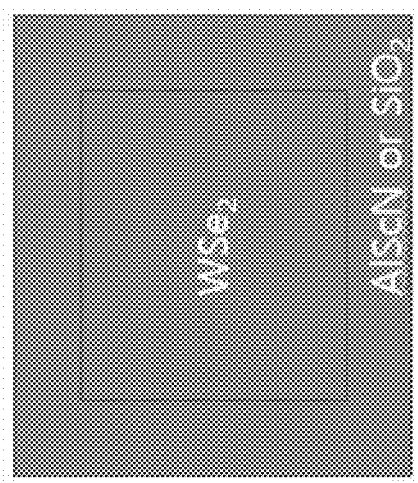
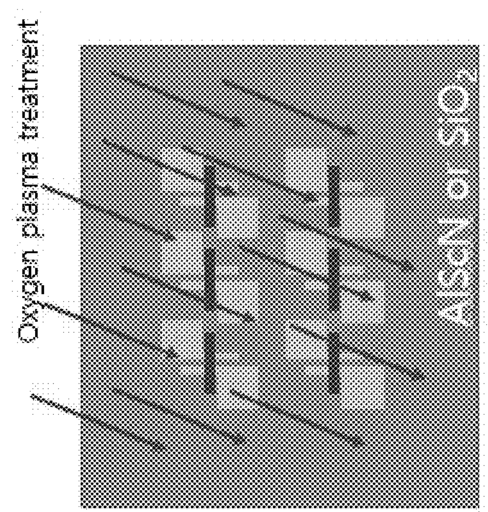
FIG. 37

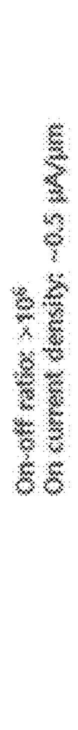
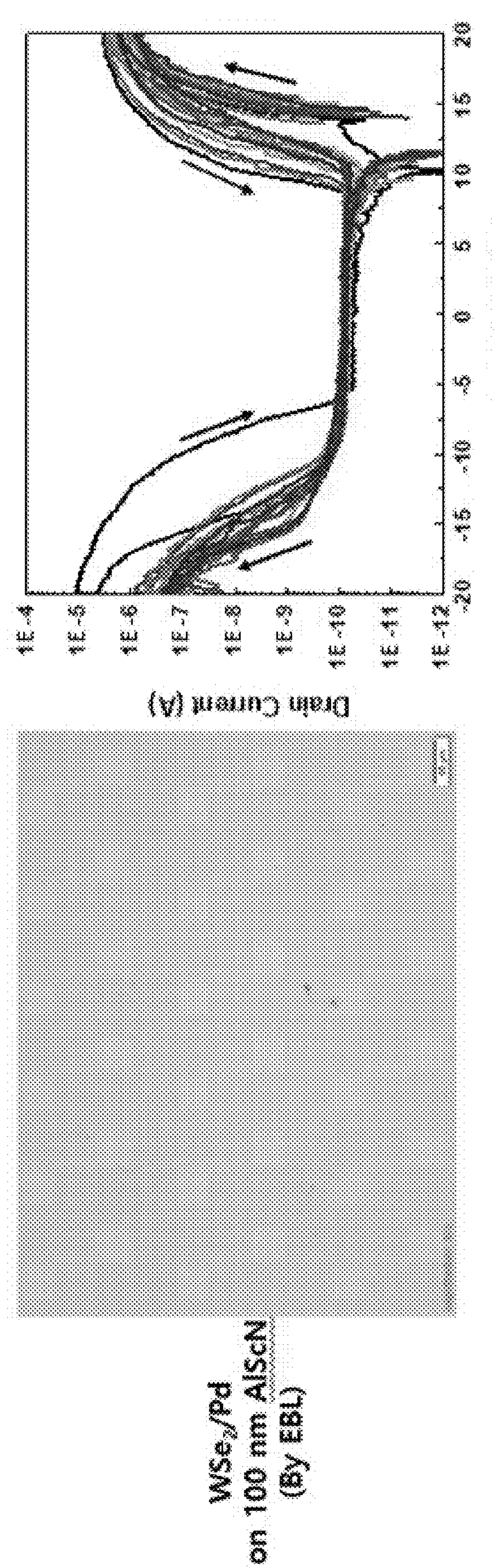
WSe$_2$/Pd on 100 nm AlScN (By EBL)
FIG. 39

$MoS_2$ film grown via CVD
$MoS_2$/Ti on
100nm AlScN (32%)

Yield: 13/15 (87 %)

On-off ratio: >$10^7$
On current density: ~71 µA/µm

POST CMOS COMPATIBLE FERROELECTRIC FIELD EFFECT TRANSISTOR WITH AlScN DIELECTRIC AND 2D MATERIAL CHANNEL

RELATED APPLICATIONS

The present application claims priority to and the benefit of U.S. patent application No. 63/042,117, "Post CMOS Compatible Ferroelectric Field Effect Transistor With AlScN Dielectric And 2D Material Channel" (filed Jun. 22, 2020), the entirety of which application is incorporated herein by reference for any and all purposes.

GOVERNMENT RIGHTS

This invention was made with government support under HR0011-20-9-0046 awarded by the Defense Advanced Research Projects Agency. The government has certain rights in the invention.

TECHNICAL FIELD

The present disclosure relates to the field of ferroelectric field effect transistor (FeFET) devices.

BACKGROUND

Strong demand for high-density non-volatile memory (NVM) with low power consumption is being driven by new applications of non-von Neumann computing architectures, the Internet of Things (IoT), and artificial intelligence (AI). Among various emerging NVM technologies, ferroelectric field effect transistor (FeFET) based nonvolatile memories are compelling, on account of their higher access speed, high endurance, and extremely low write energy and current to program/erase, while using a simple gate stack structure.

To date, however, real-world applications of FeFETs suffer severely from the lack of powerful and reliable industrial scale FE films and incompatibility with CMOS back end of line (BEOL) processing temperatures. Accordingly, there is a long-felt need for improved memory devices, which memory devices are preferably compatible with CMOS BEOL processing temperatures.

SUMMARY

In meeting the described long-felt needs, the present disclosure provides components, comprising: a portion of AlScN; a semiconducting channel portion, the channel portion being in electronic communication with the portion of AlScN, and the channel portion comprising a material characterized as a 2D material, a back-gate electrode in electronic communication with the portion of AlScN; a source electrode in electronic communication with the channel portion; and a drain electrode in electronic communication with the channel portion.

Also provided are methods, the methods comprising applying a voltage to a component according to the present disclosure.

Further provided are methods, the methods comprising fabricating a component according to the present disclosure.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

In the drawings, which are not necessarily drawn to scale, like numerals may describe similar components in different views. Like numerals having different letter suffixes can represent different instances of similar components. The drawings illustrate generally, by way of example, but not by way of limitation, various aspects discussed in the present document. In the drawings:

FIG. 6 provides cross-sectional views of exemplary RRAM and PCM memory devices, along with a cross-section of the on-state and off-state of exemplary devices according to the present disclosure. FIG. 6 also provides a comparison table between the disclosed FeFET devices and RRAM, PCM, and STT RA devices.

FIG. 7 provides an example AlScN P-E loop, a comparison table of PZT, $HfZrO_2$, and AlScN ferroelectric property parameters, and depolarization results.

FIG. 8 provides characteristics of the disclosed technology.

FIG. 9 provides XTEM and AFM results from devices made according to the present disclosure.

FIG. 13 provides an illustration of negative capacitance for AlN and AlScN.

FIG. 14 provides an illustration of the comparatively steep slopes of current-voltage curves for the disclosed technology.

FIGS. 23A-23C illustrate ferroelectric response in 100 nm AlScNf.

FIG. 37 provides a schematic illustration of a fabrication process for large areas 2D semiconductor channel/AlScN based FE-FETs with AlScN ferroelectric dielectric and a metal back gate.

FIG. 39 provides (Left) optical micrograph of an array of WSe2/AlScN FE-FETs fabricated on AlScN coated wafers. (Right) Transfer characteristics (drain current vs gate voltage) of ambipolar $WSe_2$/AlScN FE-FETs which show counter clockwise hysteresis loops for positive voltages and clockwise hysteresis loops for negative voltages for several devices.

DETAILED DESCRIPTION OF ILLUSTRATIVE EMBODIMENTS

Figures 1A, 1B:
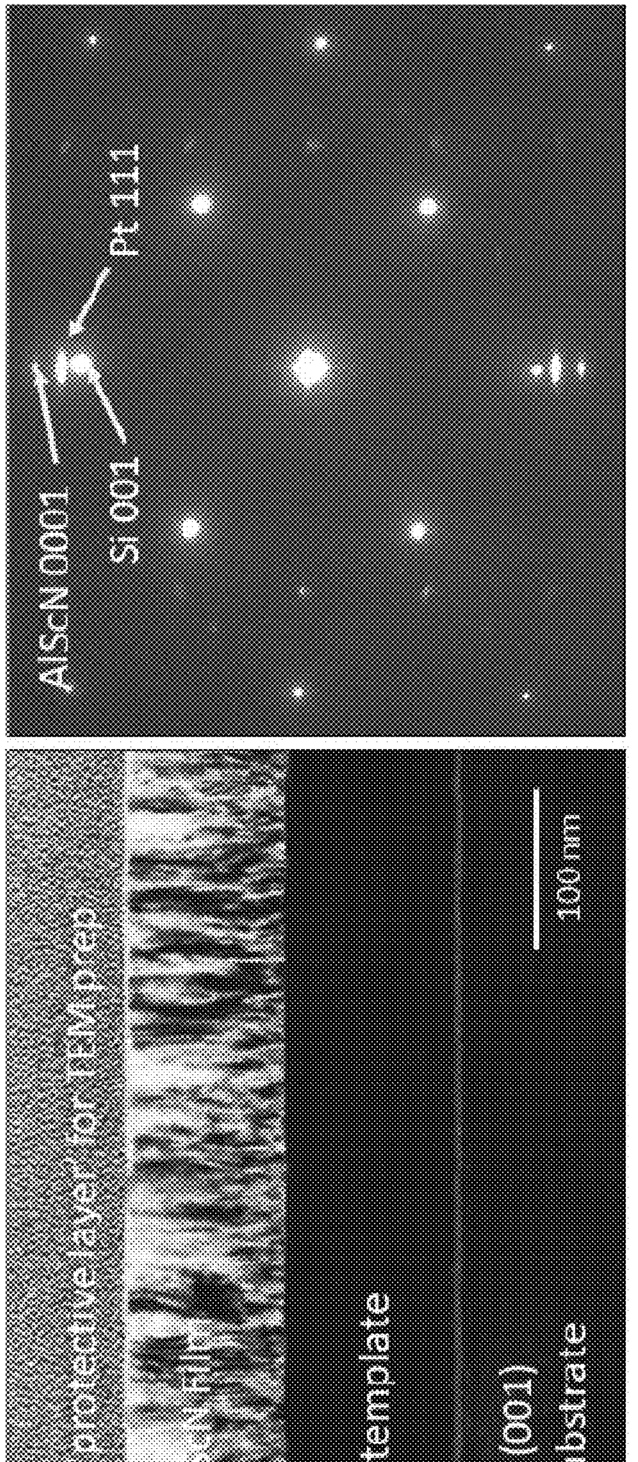
FIGS. 1A-1B provide (1A) X-TEM of AlScN ferroelectric on Si wafer templated using Pt (111) that also serves as gate electrode for the FeFET. (1B) Diffraction pattern showing the aligned nature of AlScN on Pt (111).

The present disclosure can be understood more readily by reference to the following detailed description of desired embodiments and the examples included therein.

Unless otherwise defined, all technical and scientific terms used herein have the same meaning as commonly understood by one of ordinary skill in the art. In case of conflict, the present document, including definitions, will control. Preferred methods and materials are described below, although methods and materials similar or equivalent to those described herein can be used in practice or testing. All publications, patent applications, patents and other references mentioned herein are incorporated by reference in their entirety. The materials, methods, and examples disclosed herein are illustrative only and not intended to be limiting.

The singular forms "a," "an," and "the" include plural referents unless the context clearly dictates otherwise.

As used in the specification and in the claims, the term "comprising" can include the embodiments "consisting of" and "consisting essentially of." The terms "comprise(s)," "include(s)," "having," "has," "can," "contain(s)," and variants thereof, as used herein, are intended to be open-ended transitional phrases, terms, or words that require the presence of the named ingredients/steps and permit the presence of other ingredients/steps. However, such description should be construed as also describing compositions or processes as "consisting of" and "consisting essentially of" the enumerated ingredients/steps, which allows the presence of only the named ingredients/steps, along with any impurities that might result therefrom, and excludes other ingredients/steps.

As used herein, the terms "about" and "at or about" mean that the amount or value in question can be the value designated some other value approximately or about the same. It is generally understood, as used herein, that it is the nominal value indicated ±10% variation unless otherwise indicated or inferred. The term is intended to convey that similar values promote equivalent results or effects recited in the claims. That is, it is understood that amounts, sizes, formulations, parameters, and other quantities and characteristics are not and need not be exact, but can be approximate and/or larger or smaller, as desired, reflecting tolerances, conversion factors, rounding off, measurement error and the like, and other factors known to those of skill in the art. In general, an amount, size, formulation, parameter or other quantity or characteristic is "about" or "approximate" whether or not expressly stated to be such. It is understood that where "about" is used before a quantitative value, the parameter also includes the specific quantitative value itself, unless specifically stated otherwise.

Unless indicated to the contrary, the numerical values should be understood to include numerical values which are the same when reduced to the same number of significant figures and numerical values which differ from the stated value by less than the experimental error of conventional measurement technique of the type described in the present application to determine the value.

All ranges disclosed herein are inclusive of the recited endpoint and independently of the endpoints, 2 grams and 10 grams, and all the intermediate values). The endpoints of the ranges and any values disclosed herein are not limited to the precise range or value; they are sufficiently imprecise to include values approximating these ranges and/or values.

As used herein, approximating language can be applied to modify any quantitative representation that can vary without resulting in a change in the basic function to which it is related. Accordingly, a value modified by a term or terms, such as "about" and "substantially," may not be limited to the precise value specified, in some cases. In at least some instances, the approximating language can correspond to the precision of an instrument for measuring the value. The modifier "about" should also be considered as disclosing the range defined by the absolute values of the two endpoints. For example, the expression "from about 2 to about 4" also discloses the range "from 2 to 4." The term "about" can refer to plus or minus 10% of the indicated number. For example, "about 10%" can indicate a range of 9% to 11%, and "about 1" can mean from 0.9-1.1. Other meanings of "about" can be apparent from the context, such as rounding off, so, for example "about 1" can also mean from 0.5 to 1.4. Further, the term "comprising" should be understood as having its open-ended meaning of "including," but the term also includes the closed meaning of the term "consisting." For example, a composition that comprises components A and B can be a composition that includes A, B, and other components, but can also be a composition made of A and B only. Any documents cited herein are incorporated by reference in their entireties for any and all purposes.

As noted above with respect to FIGS. 1A-5, FIGS. 1A-1B provide (FIG. 1A) X-TEM of AlScN ferroelectric on Si wafer templated using Pt (111) that also serves as gate electrode for the FeFET, and (FIG. 1B) a diffraction pattern showing the aligned nature of AlScN on Pt (111).

Figure 2:
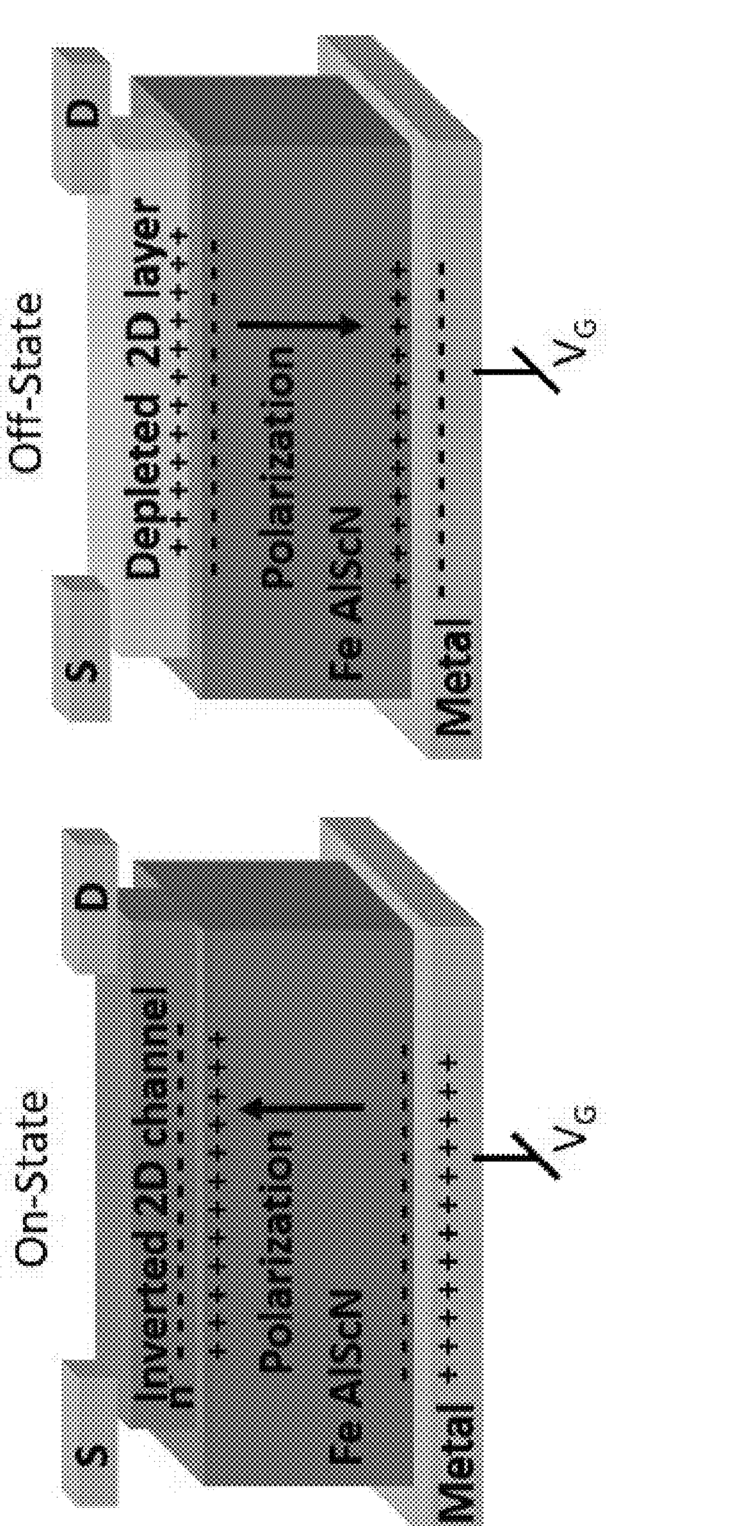
FIG. 2 provides a schematic of an experimental AlScN/$MoS_2$ FeFET in On-State and Off-States, which consists of a Pt film as the back-gate electrode, 100 nm ferroelectric AlScN as the gate dielectric, 2D thin-film $MoS_2$ as the channel semiconductor and 10 nm Ti/50 nm Au as source/drain electrodes.

FIG. 2 provides a schematic of the experimental AlScN/$MoS_2$ FeFET in On-State and Off-States, which consists of a Pt film as the back-gate electrode, 100 nm ferroelectric AlScN as the gate dielectric, 2D thin-film $MoS_2$ as the channel semiconductor and 10 nm Ti/50 nm Au as source/drain electrodes.

Figures 3A, 3B:
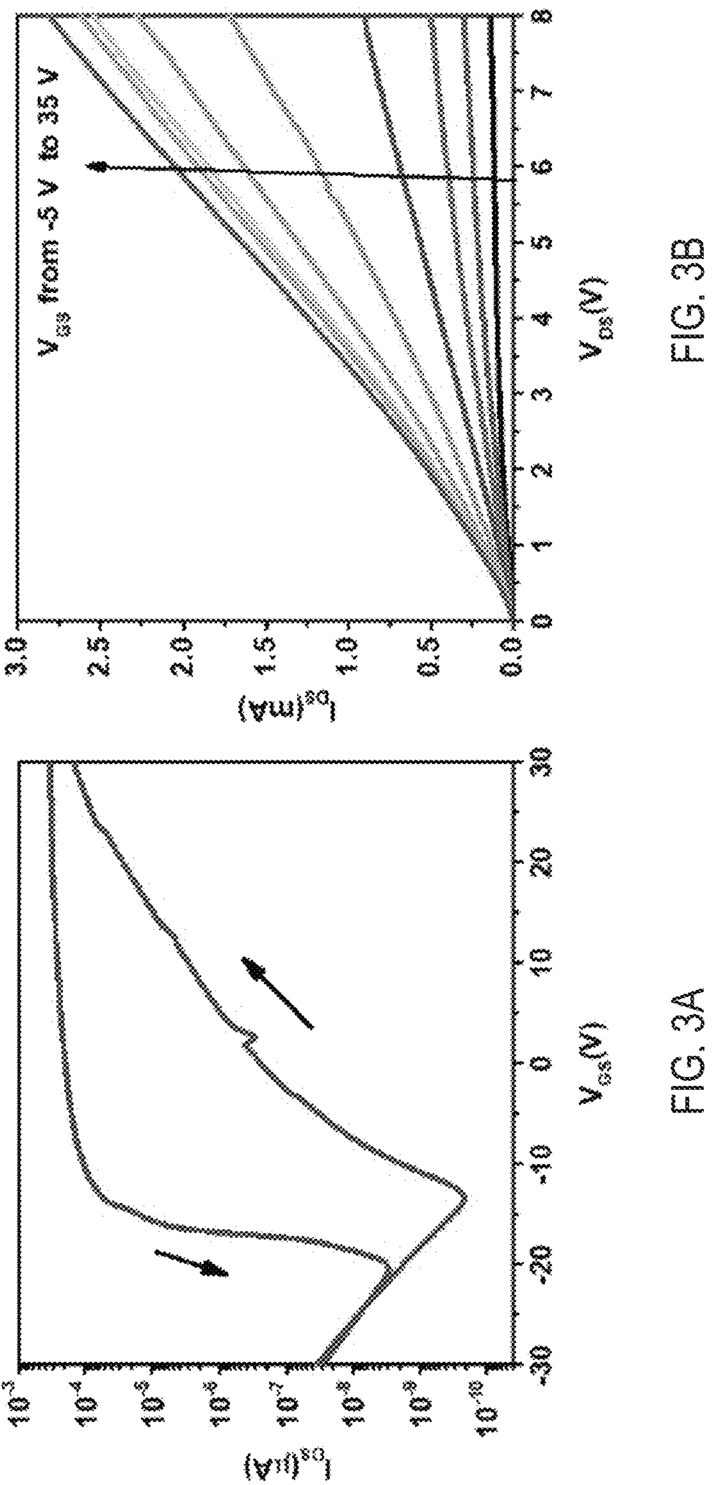
FIGS. 3A-3B provide (3A) DC transfer characteristics of an AlScN/$MoS_2$ FeFET, measured using standard SMU in Keithley 4200, in which a counterclockwise hysteresis loop has been observed, and (FIG. 3B) DC output characteristics of the AlScN/$MoS_2$ FeFET.

FIGS. 3A-3B provide (FIG. 3A) DC transfer characteristics of an AlScN/$MoS_2$ FeFET, measured using standard SMU in a Keithley 4200, in which a counterclockwise hysteresis loop has been observed, and (FIG. 3B) DC output characteristics of the AlScN/$MoS_2$ FeFET.

Figure 4:
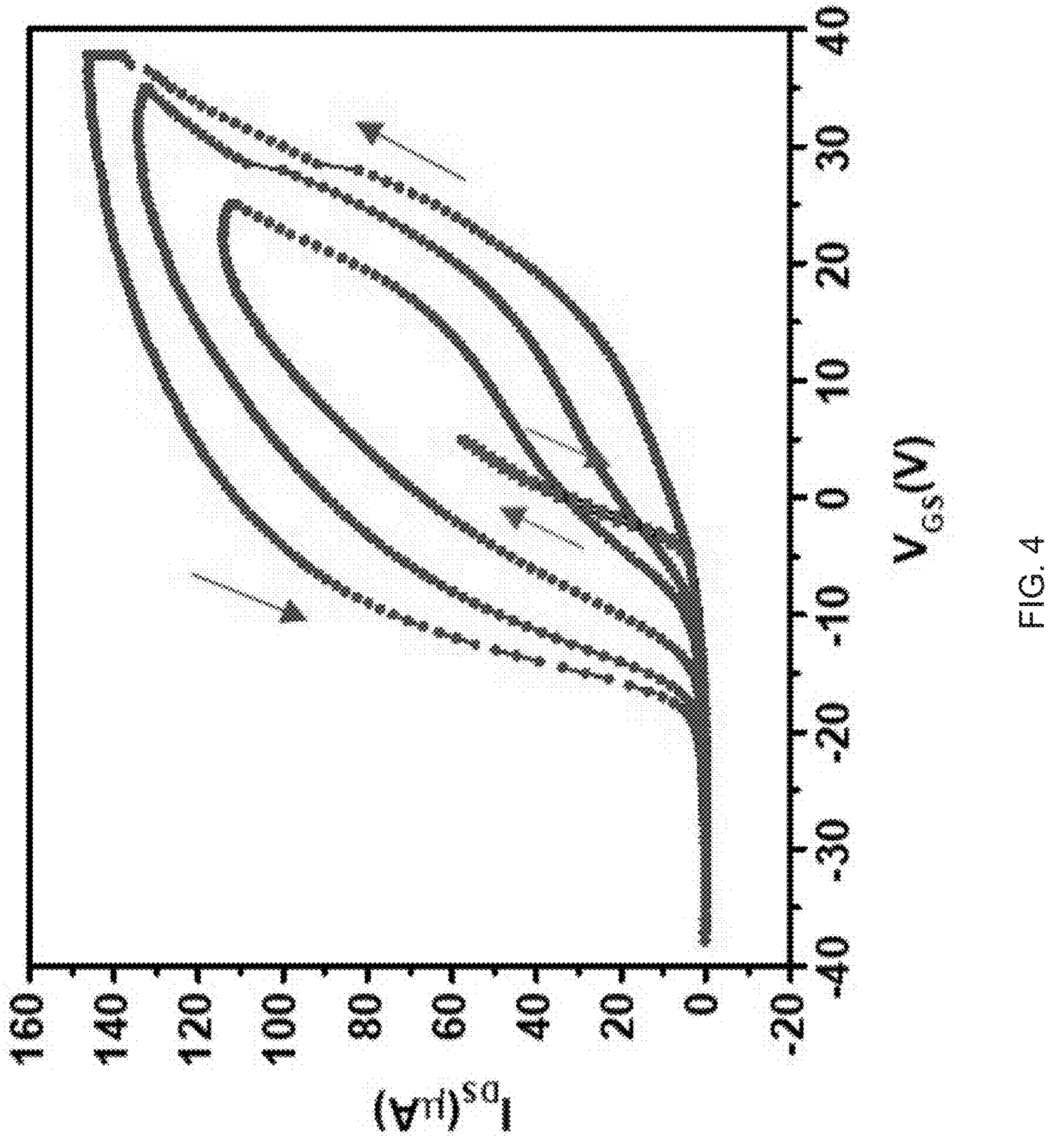
FIG. 4 illustrates the large counterclockwise hysteresis loop in AlScN/$MoS_2$ FeFETs, which indicates that the ferroelectric polarization is dominating channel conduction under large gate voltage sweeps. A negligible hysteresis loop is observed for clockwise voltage sweeps over a smaller sweeping window.

FIG. 4 illustrates the comparatively large counterclockwise hysteresis loop in AlScN/$MoS_2$ FeFETs indicates that the ferroelectric polarization is dominating channel conduction under large gate voltage sweeps. A negligible hysteresis loop is observed for clockwise voltage sweeps over a smaller sweeping window.

Figure 5:
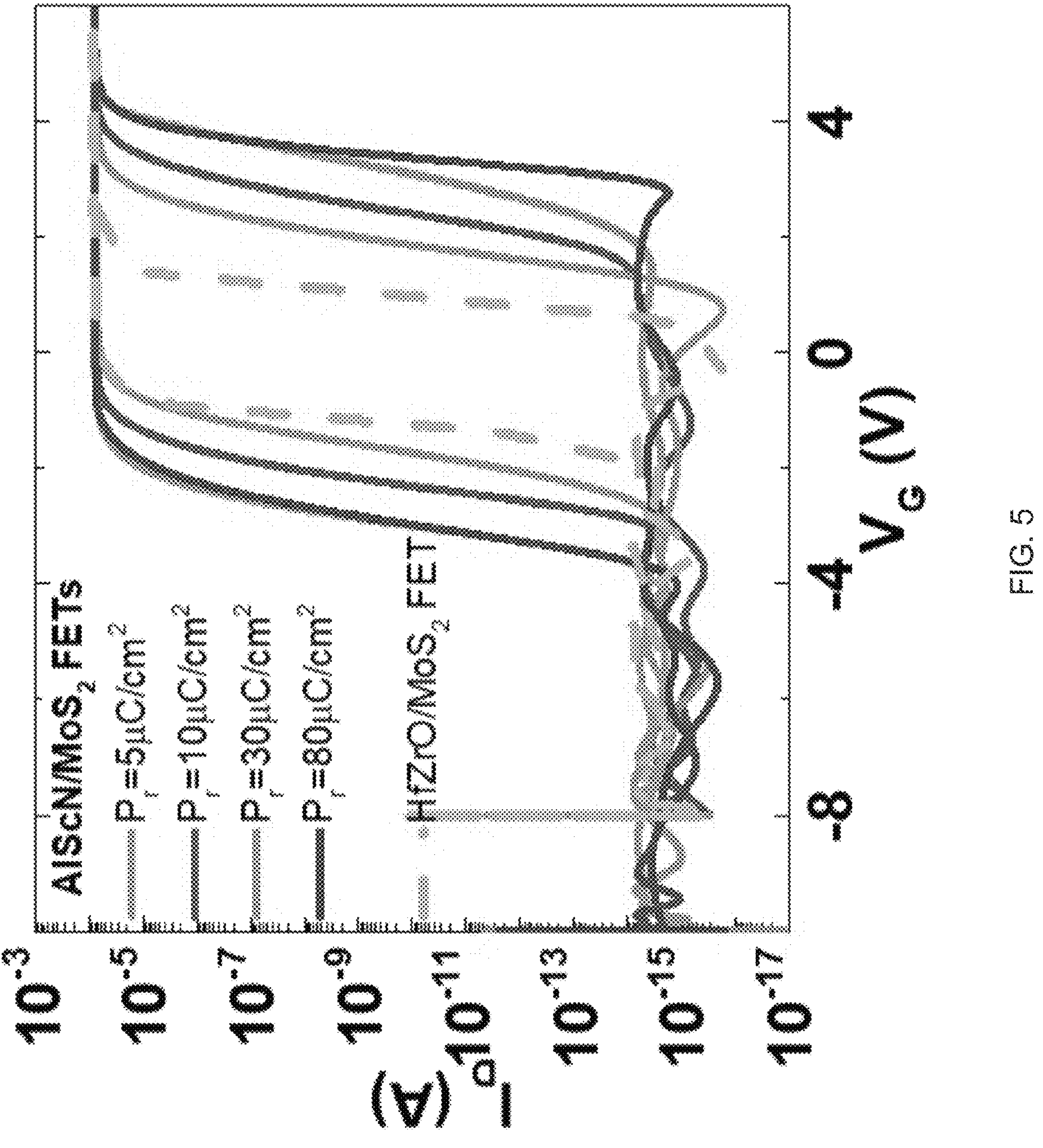
FIG. 5 provides a Sentaurus TCAD simulated memory window of AlScN-integrated FeFETs with various remnant polarizations, a fair comparison of HfZrO/$MoS_2$ FeFET has been included to benchmark the superior performance of AlScN.

FIG. 5 provides a Sentaurus TCAD simulated memory window of AlScN-integrated FeFETs with various remnant polarizations, a fair comparison of HfZrO/$MoS_2$ FeFET has been included to benchmark the superior performance of AlScN.

In addition to that described above with respect to FIGS. 6-40, FIG. 6 provides cross-sectional views of exemplary RRAM and PCM memory devices, along with a cross-section of the on-state and off-state of exemplary devices according to the present disclosure. FIG. 6 also provides a comparison table between the disclosed FeFET devices and RRAM, PCM, and STT RAM devices. Among various RRAM, PCM, and STT RAM technologies, FeFET memories are most compelling due to their high On/Off current ratio, high access speed, high endurance, and extremely low write energy and current to program/erase, while using a simple gate stack structure on commercial CMOS transistors.

FIG. 7 provides an example AlScN P-E loop, a comparison table of PZT, HfZrO2, and AlScN, and also provides depolarization results. AlScN shows large coercive fields of 2-4.5 MV/cm, which enables scaling to thinner ferroelectric layers and while maintaining a large memory window. When combined with the high remnant polarizations of 85-100 $\mu C/cm^2$, this leads to scaling of the bit density and ensures a high retention time of FeFETs against depolarization field. The low deposition temperature below 350° C. of AlScN without the need for high-temperature annealing allows for FeFET integration directly in a CMOS Back-End-of-Line (BEOL) process.

FIG. 8 provides characteristics of the disclosed technology. High coercive field found in AlScN will be helpful to achieve a large memory window; a fully depleted 2D semiconductor will achieve a high on/off ratio and eliminate/reduce the depolarization capacitor formed in partially depleted FeFETs; all processes are proven commercially at 8 inch wafer fab lines; all materials and process conditions are compatible with CMOS BEOL integration.

FIG. 9 provides XTEM and AFM results from devices made according to the present disclosure. FIG. 9 part (a) provides an overall image of the bright-field TEM images of a 100 nm thick AlScN with 29% scandium on Pt. FIG. 9 part (b) highlights Si—Ti—Pt interface and Ti—Pt interdiffusion. FIG. 9 part (c) shows atomic layer resolution image of the Pt—AlScN interface. In FIG. 9 part (d), high magnification image shows the textured growth of AlScN directly on the Pt without an amorphous region or "dead layer". Also, AFM images have shown uniform surface morphology and small surface roughness over the full wafer.

Figure 10:
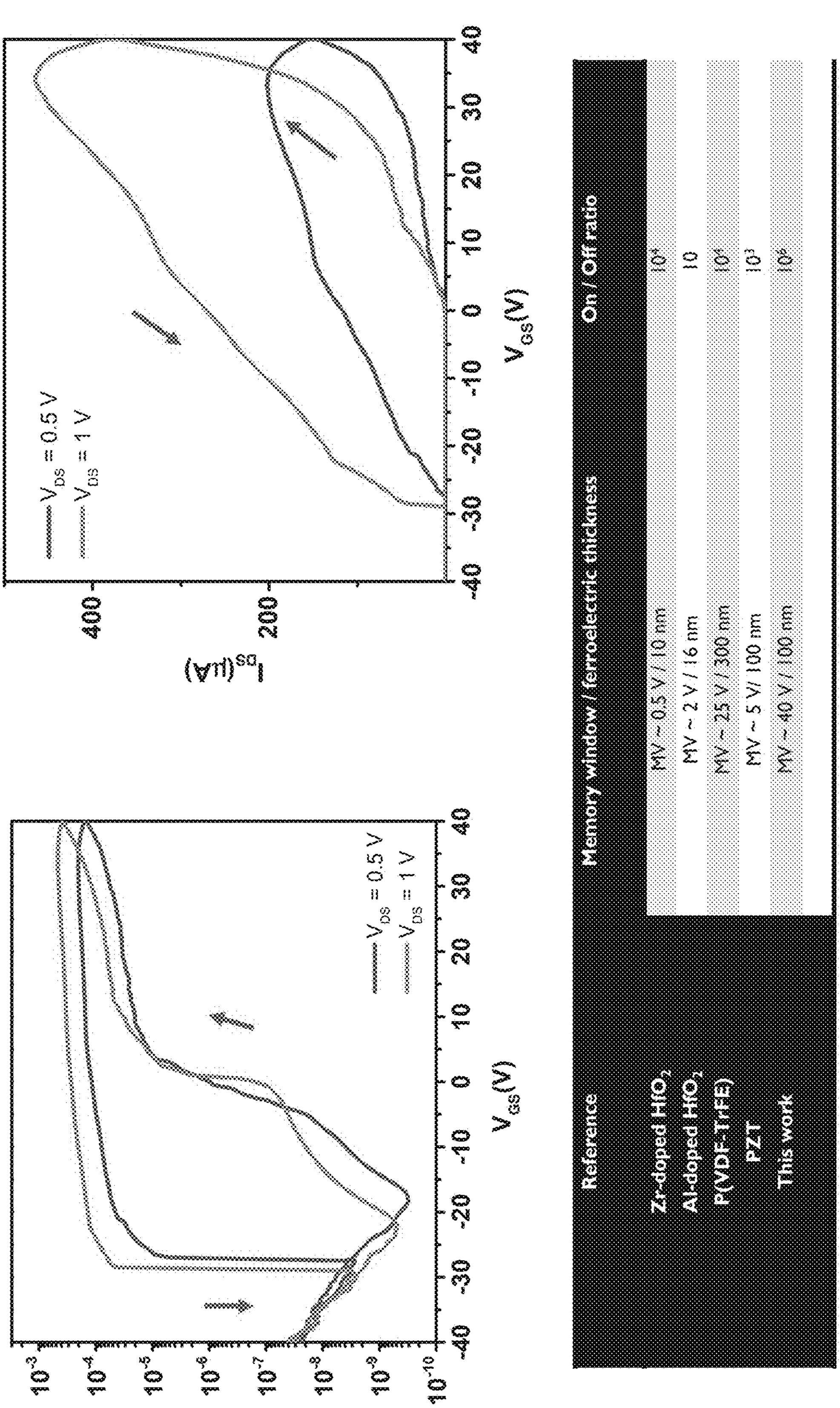
FIG. 10 provides exemplary hysteresis loops and also provides comparative results between the disclosed devices and existing technologies.

FIG. 10 provides exemplary hysteresis loops and also provides comparative results between the disclosed devices and existing technologies. The on/off ratio of the fabricated FeFETs is ~$10^6$. The large counterclockwise hysteresis loop measured in FeFETs indicates that the ferroelectric polarization is dominating channel conduction. With 100-nm-thick AlScN as a ferroelectric dielectric, the resulting devices show a large memory window in a range of 30 to 40 V. The normalized memory window, divided by the thickness of the ferroelectric film, is 0.4 V/nm, which is a recorded large value reported for a FeFET at room temperature compared to other results in the table, to the best knowledge.

Figure 11:
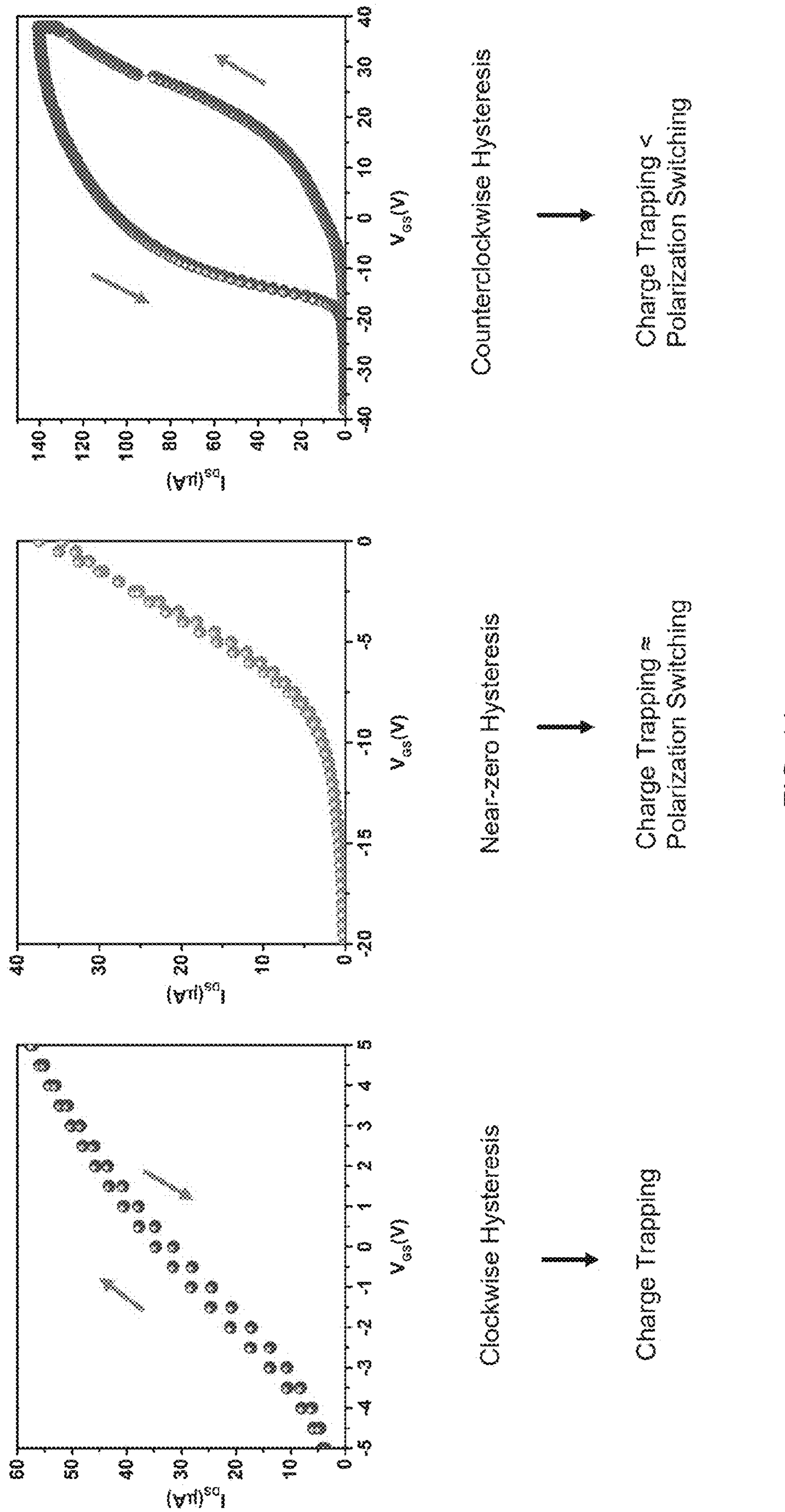
FIG. 11 provides depictions of clockwise hysteresis, near-zero hysteresis, and counterclockwise hysteresis.

FIG. 11 provides depictions of clockwise hysteresis, near-zero hysteresis, and counterclockwise hysteresis. The evidence of ferroelectricity in AlScN has been highlighted by FIG. 11 where the FeFET hysteresis is shown as a function of the gate voltage sweep range. The hysteresis is observed to reverse from clockwise to counterclockwise with the onset of polarization switching occurring at a higher gate voltage. For a small sweep range, the hysteresis is observed to be clockwise, indicating charge trapping is dominating the hysteresis loop and ferroelectric polarization has not been flipped yet. For a large sweep range, the hysteresis is observed to be counterclockwise, indicating the onset of polarization switching. The magnitude of the two effects are approximately balanced for a mediate sweep range, producing near-zero hysteresis in the transfer characteristics.

Figure 12:
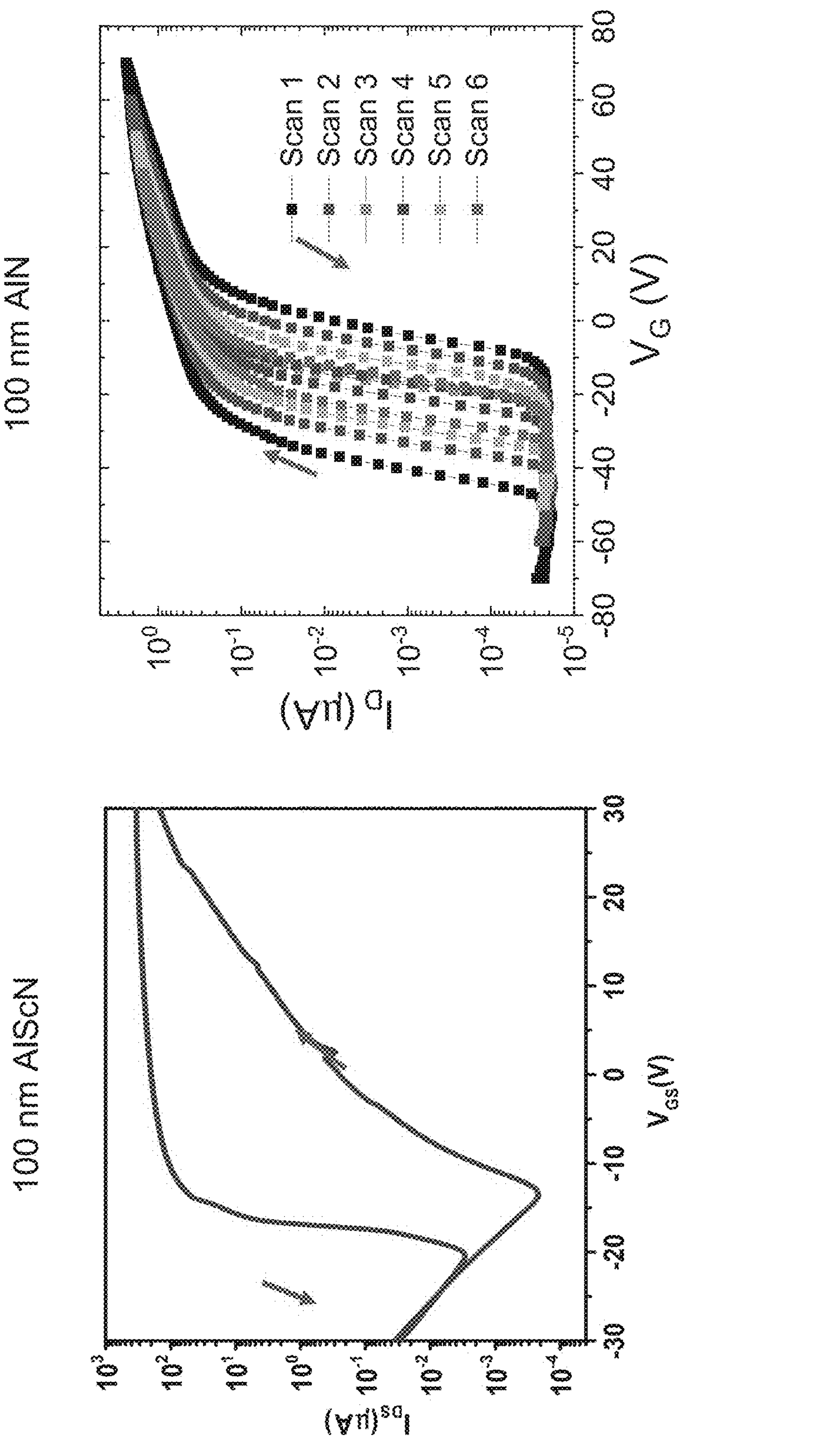
FIG. 12 provides example control FET results, comparing AlN and AlScN.

FIG. 12 provides example control FET results, comparing AlN and AlScN. Control FETs on a conventional non-doped (Scandium free) AlN has also been made to further support the finding of ferroelectricity in AlScN. The AlN film of same thickness was sputtered in the same deposition system. Hysteresis has also been observed to be comparable to oxide dielectrics, but in the clockwise direction only, which is attributed to charge trapping. The hysteresis loop direction does not flip sign upon change in sweep range up to 70 V. This also serves as a strong evidence that the counterclockwise hysteresis in AlScN FETs is induced by polarization switching.

FIG. 13 provides an illustration of negative capacitance for AlScN. In a negative capacitance FET, the ferroelectric layer serves as a negative capacitor so that the channel surface potential can be amplified more than the gate voltage, and hence the device can operate with subthreshold swing less than 60 mV/dec at room temperature. The demonstrated 2D-FETs on AlScN exhibited marked enhancement in low-voltage switching behavior compared to the 2D-FET with the same channel on AlN of same thickness, reducing the subthreshold swing by 2 orders of magnitude. The abrupt and dramatic switching behavior displayed in the figure is a direct effect of integrating a ferroelectric layer into the gate.

FIG. 14 provides an illustration of the comparatively steep slopes of current-voltage curves for the disclosed technology. The subthreshold characteristics of a 2D FETs on AlScN with drain-source bias of 1 V are given in the FIG. 14. The observed subthreshold swing falls below the thermal limit for over 3 decades of current, with an average of 30 mV/dec.

Figure 15:
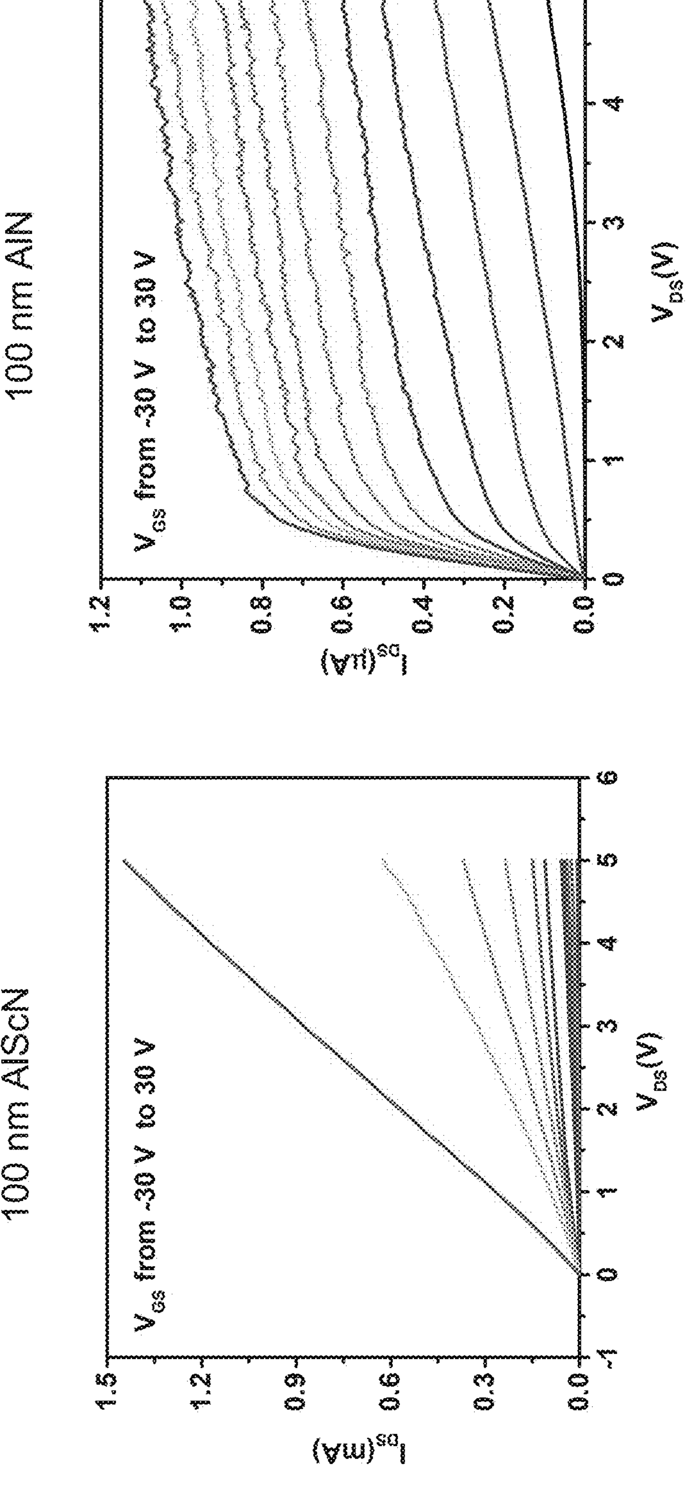
FIG. 15 provides output characterizations for AlN and AlScN.

FIG. 15 provides output characterizations for AlN and exemplary AlScN. Both of the two transistors show a normal output behavior with good contacts. The extracted maximum on-current of the AlScN FETs are about ~100 times higher than the FETs using an AlN gate dielectric of similar device dimensions and dielectric thicknesses. Given a comparable dielectric constant for AlScN ($\varepsilon_r$~14) and AlN ($\varepsilon_r$~10), the improvement of on current level is associated with the high polarization in AlScN.

FIGS. 16A-16D provide (FIG. 16A) a schematic view of a AlScN/$MoS_2$ FE-FETs. The gate stack includes 100-nm-Pt on Si as the gate electrode, 100 nm AlScN as the ferroelectric gate dielectric. A ~3 nm native oxide layer naturally occurs on top of ferroelectric AlScN due to ambient air exposure. (FIG. 16B) A cross-sectional TEM image of a representative sample showing the source-drain contact, $MoS_2$ channel, amorphous oxide and polycrystalline AlScN gate dielectric. (FIG. 16C) a SAED pattern of ferroelectric AlScN film showing templating along (0001) (c-plane) direction. (FIG. 16D) a High-resolution phase-contrast TEM image obtained from the channel/dielectric interface in c where the individual $MoS_2$ layers in the channel and surface oxide layer are visible.

FIGS. 17A-17F provides a room-temperature electrical characterization of AlScN/$MoS_2$ FE-FETs. (FIG. 17A) The PUND results of a 100 nm AlScN thin film with a pulse width of 10 μs and 1 ms delay between pulses. The PUND test reveals a saturated remanent polarization of 80 $\mu C/cm^2$ and a ferroelectric switching voltage over 50V. The inset is a monopolar triangular wave PUND with 100 ms pulse width and a zero-to-peak voltage of 40V, suggesting a ferroelectric switching voltage between 30 V-40 V. (FIG. 17B) Semi-logarithmic scale transfer characteristics at room temperature of a representative AlScN/$MoS_2$ FE-FET with 100 nm AlScN as ferroelectric gate dielectric. The channel length is 3.2 μm and the channel width is 14.8 um for the device shown. The arrows show the clockwise hysteresis of the drain current, which is consistent with accumulation and depletion of electrons. The device exhibits a large memory window (~30 V) (counterclockwise hysteresis loop) and on/off drain-to-source resistance ratio up to $10^6$. (FIG. 17C) TCAD simulations of $MoS_2$ FE-FETs with ferroelectric dielectric of 100-nm-thick PZT, $HfO_2$, and AlScN, respectively showing counterclockwise transfer curve hysteresis loops of. (FIG. 17D) Linear-scale output characteristics of the same device at various gate voltages. (FIG. 17E) Endurance measurements of the ON and OFF memory states of the FE-FETs with number of gate-voltage cycles. The gate voltage cycles ranges were from −40 V to +40 V. (FIG. 17F) Resistance state retention measurement obtained by programming the ON- or OFF-state with a gate voltage of ±40 V, then monitoring the drain current for varying time intervals up to 100,000 secs.

Figures 18A, 18B, 18C:
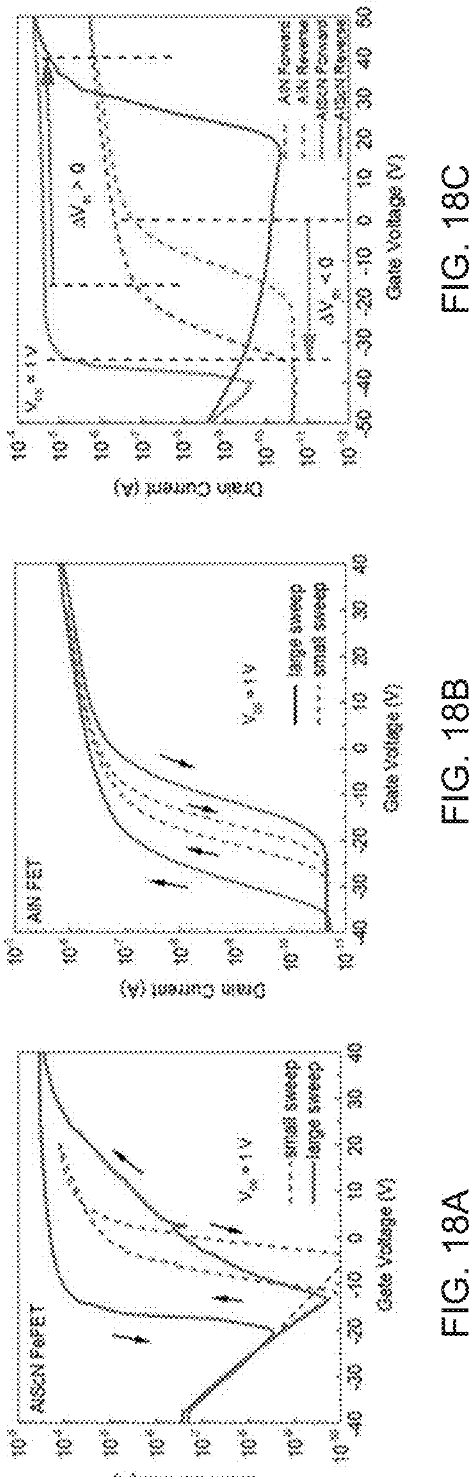
FIGS. 18A-18C provide a comparison of AlScN/MoS2 FE-FETs with reference AlN/MoS2 FETs.

FIGS. 18A-18C provide a comparison of AlScN/$MoS_2$ FE-FETs with reference AlN/$MoS_2$ FETs. (FIG. 18A) Semi-logarithmic scale transfer characteristics at room temperature of a representative AlScN/$MoS_2$ FE-FETs with a large gate voltage sweep range (solid blue line) and a small gate voltage sweep range (dashed grey line). The device has an AlScN thickness of 100 nm, a channel length of 3.75 μm and channel width of 15 μm. The arrows show the hysteresis directionality of the transfer curves. For a small sweep range (from −20 V to 20 V), the hysteresis is observed to be clockwise, indicating charge trapping and no ferroelectric switching. Conversely, for a large sweep range, the hysteresis is observed to be counterclockwise, indicating the occurrence of FE polarization switching. (FIG. 18B) Semi-logarithmic scale transfer characteristics at room temperature of a representative AlN/$MoS_2$ FET with both a large gate sweep range (solid blue line) and a small gate sweep range (dash grey line). The device has an AlN gate thickness of 100 nm, a channel length of 3.6 μm and channel width of 10 μm. For both small and large gate voltage sweep ranges, the hysteresis is observed to be clockwise, indicating that charge traps dominate the threshold voltage shifts and no ferroelectricity is present. (FIG. 18C) Comparative transfer characteristics during both forward and back ward sweeps in the +−50 V range for AlScN and AlN dielectric $MoS_2$ FETs. The clear and opposite signs of threshold voltage shifts between AlScN/$MoS_2$ FE-FET and AlN/$MoS_2$ FET for forward (red) and reverse (blue) sweeps is shown. The large differences in ON currents between the two transistors and the marked enhancement in steepness of the sub-threshold swing in AlScN based $MoS_2$ FETs as compared AlN based FETs is also evident.

Figure 19B:
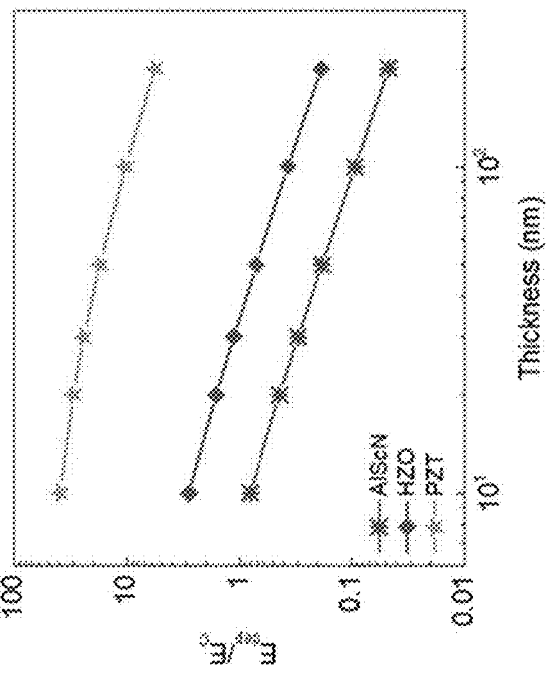
FIGS. 19A-19B provide performance comparison of the AlScN/MoS2 FE-FETs with previously reported FE-FETs including traditional PZT FE-FETs and the state-of-the-art $HfO_2$ FE-FETs.
Figure 19A:
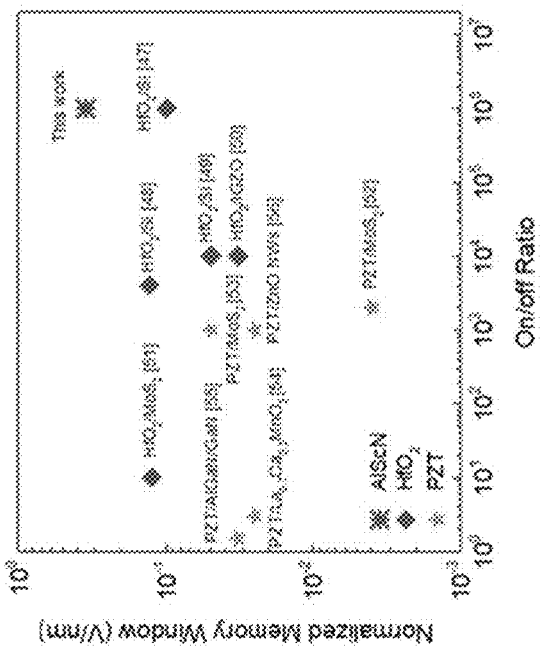

FIGS. 19A-19B provide (FIG. 19A) performance comparison of the AlScN/$MoS_2$ FE-FETs with previously reported FE-FETs including traditional PZT FE-FETs and the state-of-the-art $HfO_2$ FE-FETs. a, ON/OFF current ratios and normalized memory window from the reported Fe-FETs in the literature with HZO and PZT dielectrics paired with Si and 2D semiconductor channels. It is worth noting that the reported AlScN-based FE-FET lies closest to the top-right corner of the plot. (FIG. 19B) The calculated ratio of depolarization field over coercive field ($E_{dep}/E_c$) in three different FE-FET cases: 1) AlScN+1 nm buffer layer, 2) $HfO_2$+1 nm buffer layer, and 3) PZT+1 nm interfacial insulating layer shown as a function of varying thickness of the FE dielectric. $E_{dep}/E_c$ in AlScN FE-FETs is much smaller than its $HfO_2$ and PZT FE-FET counterparts with $E_{dep}/E_c$ ratio less than 1 even when scaled to 10 nm thicknesses.

Figure 20B:
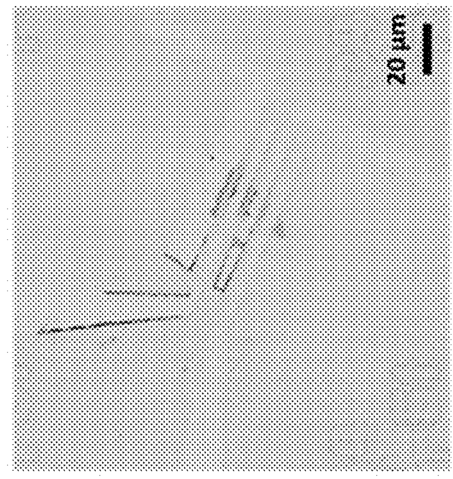
FIGS. 20A-20B provide optical micrographs of AlScN/MoS2 FE-FET devices.
Figure 20A:
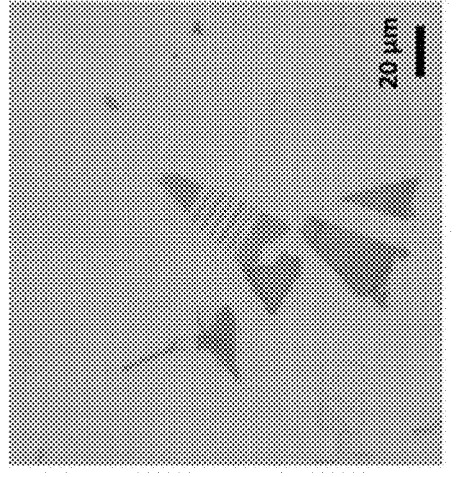

FIGS. 20A-20B provide optical micrographs of AlScN/MoS2 FE-FET devices.

Figure 21B:
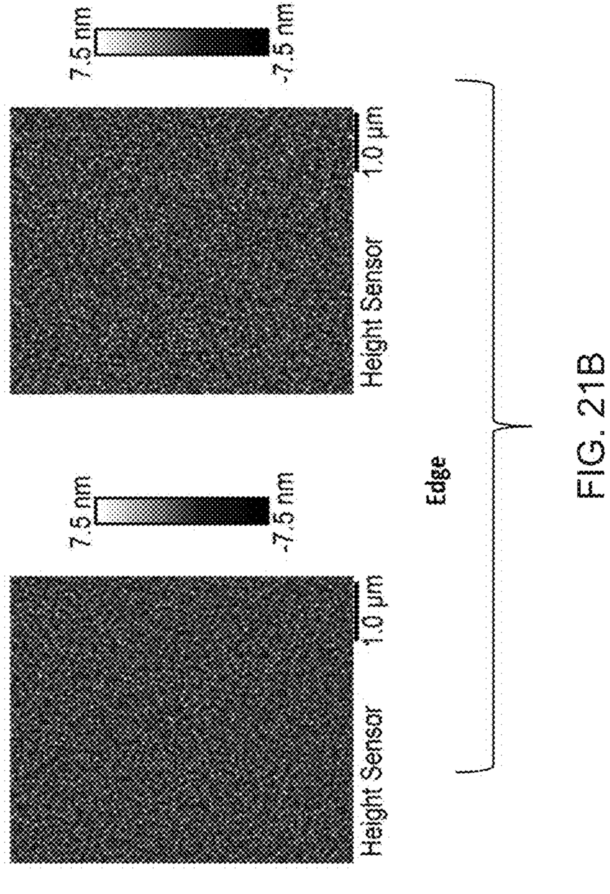
FIGS. 21A-21B provide AFM topography image of a low temperature deposited AlScN ferroelectric across 4-inch wafer FIG. 22 provides TEM characterization of a AlScN/MoS2 FeFETs.
Figure 21A:
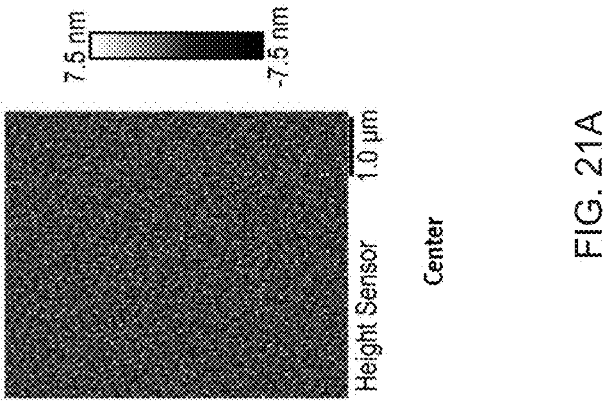

FIGS. 21A-21B provide AFM topography image of a low temperature deposited AlScN ferroelectric across 4-inch wafer. (FIG. 21A)-(FIG. 21B) Center and edge AFM images across the 4-inch wafer, showing uniform surface morphology and small surface roughness of 1.3 nm over the full wafer.

Figure 22:
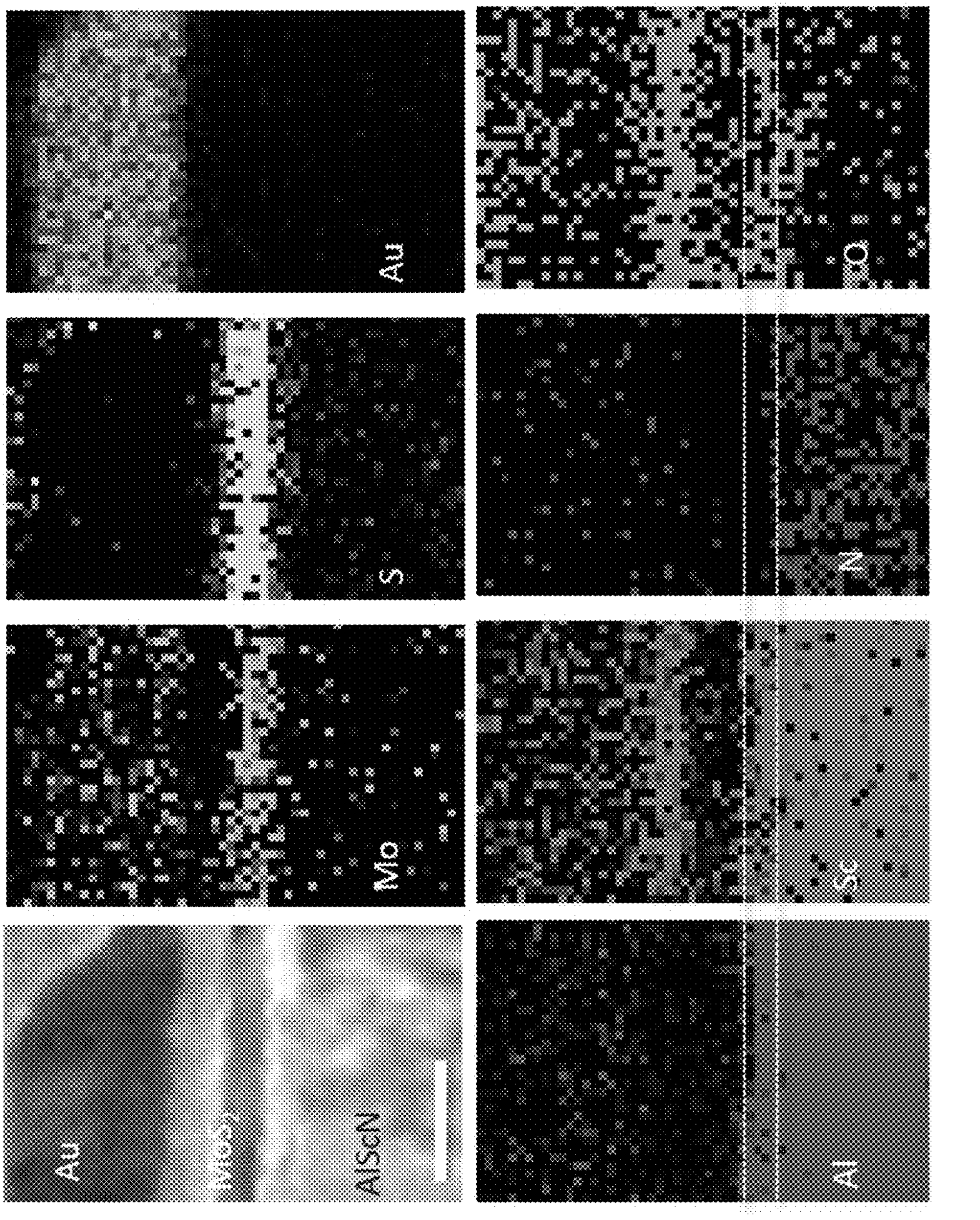

FIG. 22 provides TEM characterization of a AlScN/$MoS_2$ FeFETs. (upper left) Cross-sectional TEM image of a representative AlScN/$MoS_2$ FeFETs showing AlScN gate ferroelectric, $MoS_2$ and Ti/Au source/drain electrode. Scale bar, 20 nm. (remainder) Electron dispersive spectroscopy (EDS) map of the transistor region showing spatial distribution of Sc, N, Al, O, Mo and S elements, thus confirming the location of the AlScN and $MoS_2$ in the device. The oxide layer is indicated in between dashed lines, demonstrating Nitrogen atoms are replaced by Oxygen atoms.

FIGS. 23A-23C illustrate ferroelectric response in 100 nm AlScN. (FIG. 23A)-(FIG. 23B), Schematics of the signal sequences for the PUND measurements to differentiate the ferroelectric and non-ferroelectric contributions to the polarization, corresponding to FIG. 17A and inset. (FIG. 23C) The P-E hysteresis loops of a 100 nm thick AlScN on [111] at 100 kHz. The hysteresis loops are saturated in the negative field half of the loops, whereas large leakage current contributions can be seen in the positive field region, indicating a polarization direction-dependent leakage current. The polarization extracted from the saturated field matches the results we measured with PUND method. Leakage optimization of the FE films is subject of ongoing work.

Figures 24A, 24B, 24C:
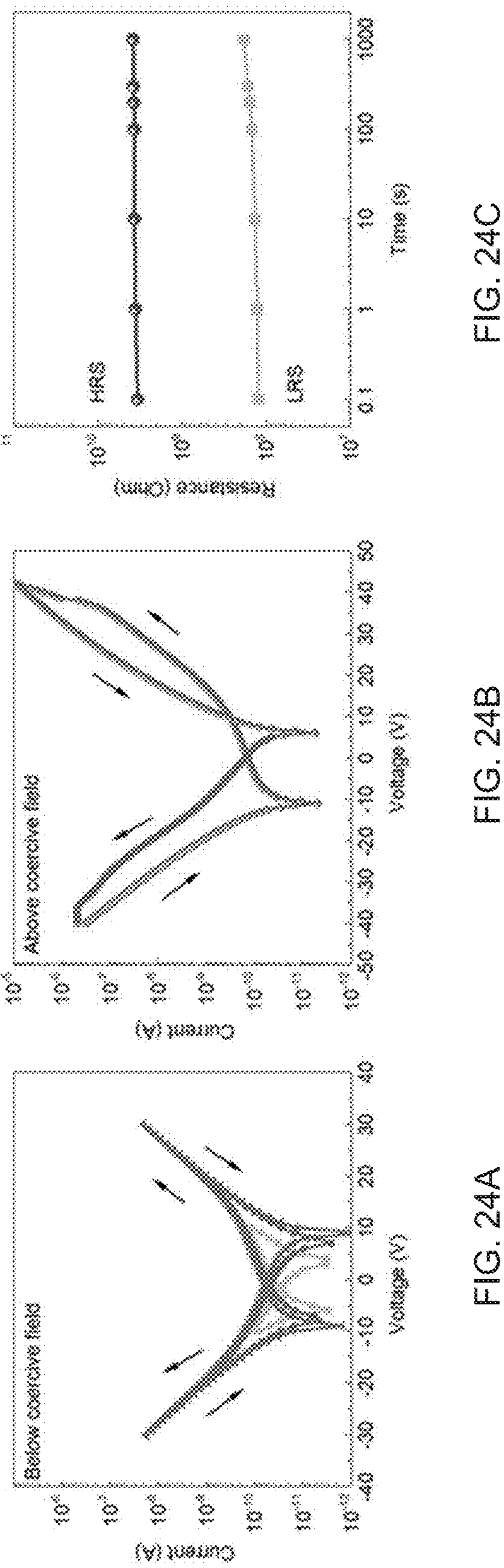
FIGS. 24A-24C illustrate non-volatile resistive switching of an AlScN ferroelectric MIM device diode.

FIGS. 24A-24C illustrate a non-volatile resistive switching of an AlScN ferroelectric MIM device diode. (FIG. 24A)-(FIG. 24B) Current-voltage characteristics of the demonstrated AlScN ferroelectric MIM device with applied electrical field below- and above-coercive field, respectively. Ferroelectric MIM device demonstrated non-volatile resistive switching by utilizing tunnel barrier modulation upon ferroelectric polarization switching. The current can only be switched from a high-resistance state (HRS) to a low-resistance state (LRS) by applying a voltage higher than the coercive voltages, as shown in FIGS. 23A-23B, which indicates the coercive voltage is between 30-40 V under DC measurement. (FIG. 24C) Retention properties of the resistance state as a function of time obtained by programming the LRS and HRS with a gate voltage of ±40 V, then monitoring the resistance for 1,000 secs. No significant degradation was observed on both LHS and HRS.

Figure 25B:
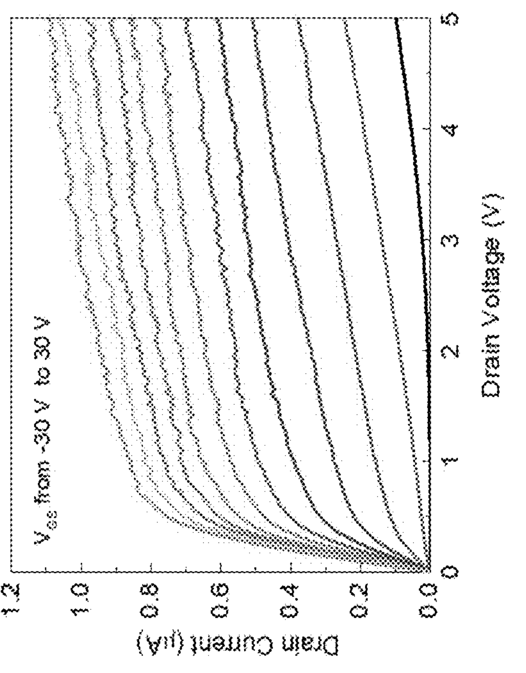
FIGS. 25A-25B provide room-temperature electrical characterization of a AlN/MoS2 FET.
Figure 25A:
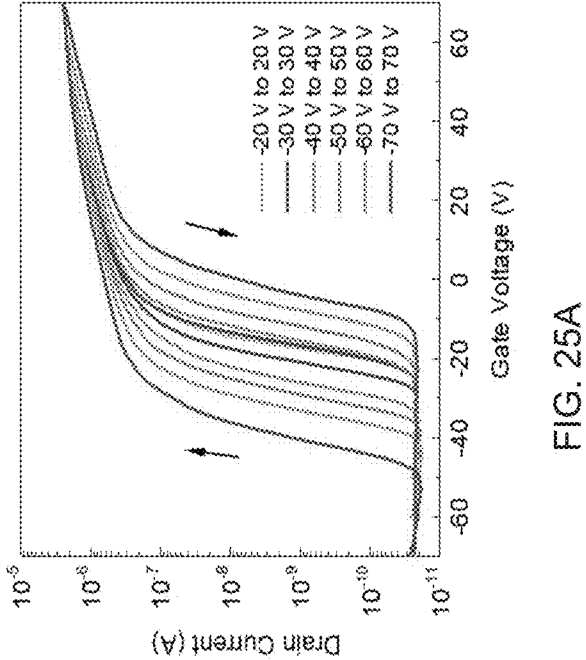

FIGS. 25A-25B illustrate a room-temperature electrical characterization of a AlN/$MoS_2$ FET. (FIG. 25A) The AlN/$MoS_2$ FET was made from the same fabrication process as the AlScN/$MoS_2$ FeFETs. Source and drain electrodes are made from e-beam deposited Ti/Au (10 nm/40 nm). (FIG. 25B) Linear scale output characteristics of the same device at various gate voltages showing saturation in the channel. Transfer characteristics of an AlN/$MoS_2$ FET at $V_{DS}$=1 V with various gate voltage sweep ranges up to ±70 V. Significant clockwise hysteresis was observed, which is attributed to the charge trapping. The hysteresis loop direction doesn't flip sign upon a change in sweep range up to ±70 V, which serves as a strong evidence that the counterclockwise hysteresis in AlScN/$MoS_2$ FeFETs is induced by ferroelectric polarization switching.

Figures 26A, 26B, 26C:
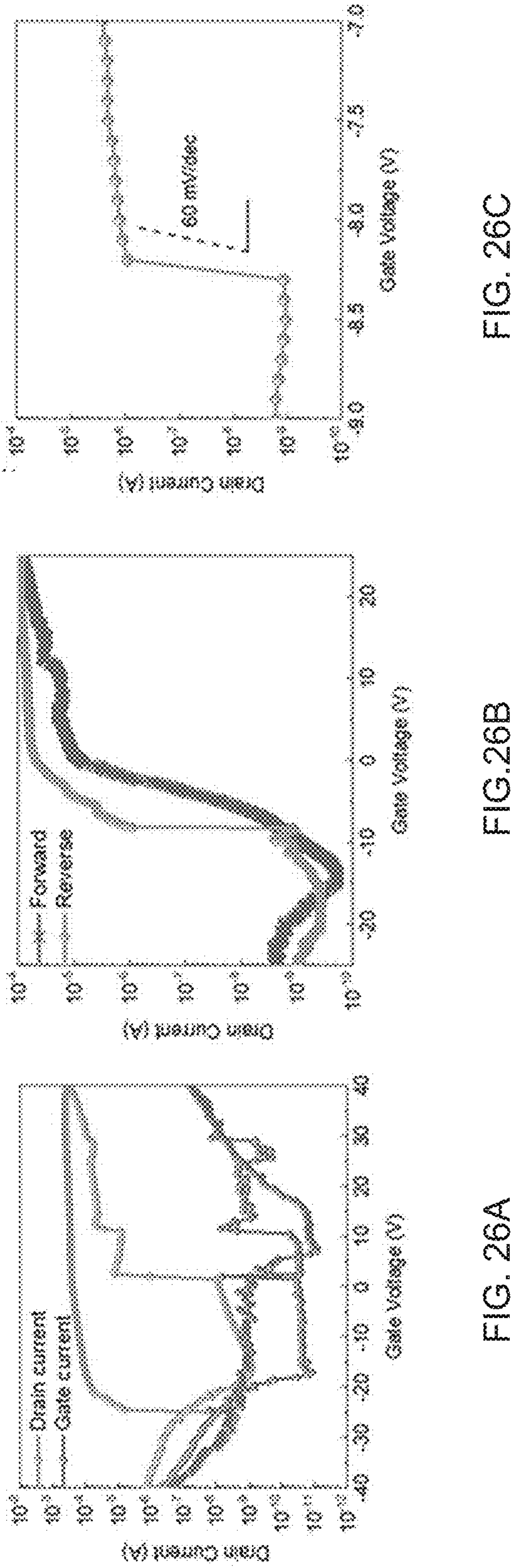
FIGS. 26A-26C provide steep sub-threshold slope induced by negative capacitance through integrating ferroelectric AlScN in the gate stack.

FIGS. 26A-26C illustrate the steep sub-threshold slope induced by negative capacitance through integrating ferroelectric AlScN in the gate stack. (FIG. 26A) Drain- and gate-current versus gate voltage in the AlScN/$MoS_2$ FeFETs with drain voltage at 1 V. (FIG. 26B)-(FIG. 26C), Transfer curve of AlScN/$MoS_2$ FeFETs with drain voltage at 1 V, showing a steep sub-threshold slope switching. It has been shown that a ferroelectric material integrated into the gate stack of a transistor can create an effective negative capacitance that allows the device to overcome "Boltzmann tyranny". The insulating ferroelectric layer serves as a negative capacitor so that the channel surface potential can be amplified more than the gate voltage, and hence the device can operate with subthreshold swing less than 60 mV/dec even at room temperatures. In a, it is interesting to notice that along with the abrupt rise or drop in drain current at about the threshold voltage, there is a simultaneous spike in the gate current that can be attributed to the amplified gate field across the gate dielectric. As shown in b and c, the subthreshold swing was observed to fall below the thermal limit ~60 mV/dec for over 3 decades of current, with an average of 30 mV/dec further strongly indicating FE switching in our AlScN/$MoS_2$ FET devices.

Figure 27B:
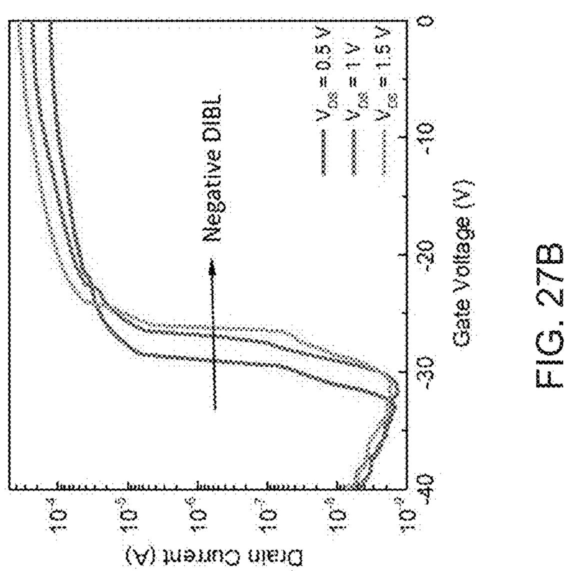
FIGS. 27A-27B illustrate Negative drain-induced-barrier-lowering (DIBL) induced by negative capacitance in the gate stack.
Figure 27A:
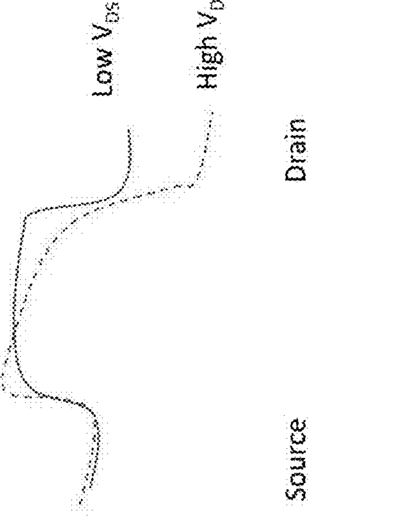

FIGS. 27A-27B illustrate negative drain-induced-barrier-lowering (DIBL) induced by negative capacitance in the gate stack. (FIG. 27A) Band diagram of the negative DIBL effect. The negative DIBL originates from capacitive coupling from the drain to the gate stack of AlScN and $MoS_2$. (FIG. 27B) Transfer characteristics of AlScN/$MoS_2$ FETs measured at room temperature and at drain voltages of 0.5 V, 1 V and 1.5 V. A threshold voltage shift towards the positive can be observed at high drain voltage, indicating a negative DIBL effect, characteristic of an FE dielectric in the stack.

Figure 28B:
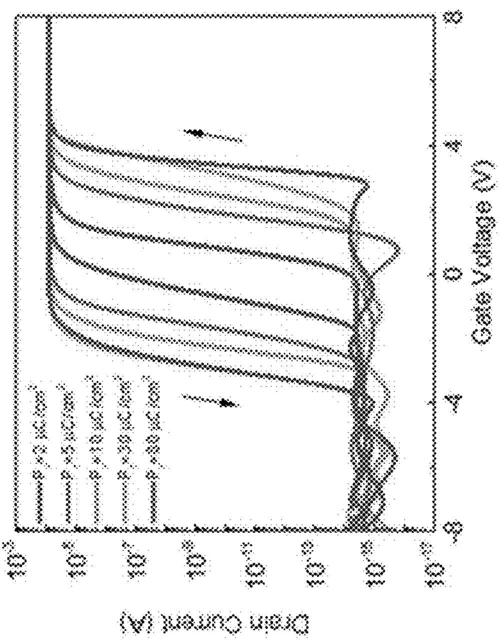
FIGS. 28A-28B provide a TCAD simulation of AlScN/MoS2 FeFTEs with various remanent polarizations.
Figure 28A:
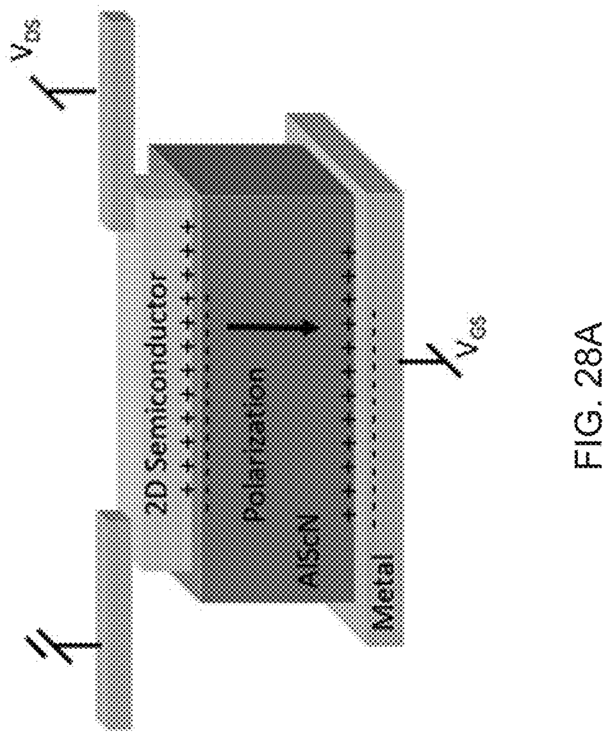

FIGS. 28A-28B illustrate TCAD simulation of AlScN/$MoS_2$ FeFETs with various remanent polarizations. (FIG. 28A) The schematic of the proposed AlScN/$MoS_2$ FeFETs in the TCAD simulation. (FIG. 28B) Semilogarithmic scale simulated transfer characteristics at room temperature of a representative AlScN/$MoS_2$ FeFET with 100 nm AlScN as the gate ferroelectric dielectric with a channel thickness of 10 nm, a channel length of 1 μm. The AlScN/$MoS_2$ FeFET has been simulated with varying amounts of remnant polarization for the AlScN showing a large memory window that saturates for remanent polarizations >30 $\mu C/cm^2$.

Figure 29B:
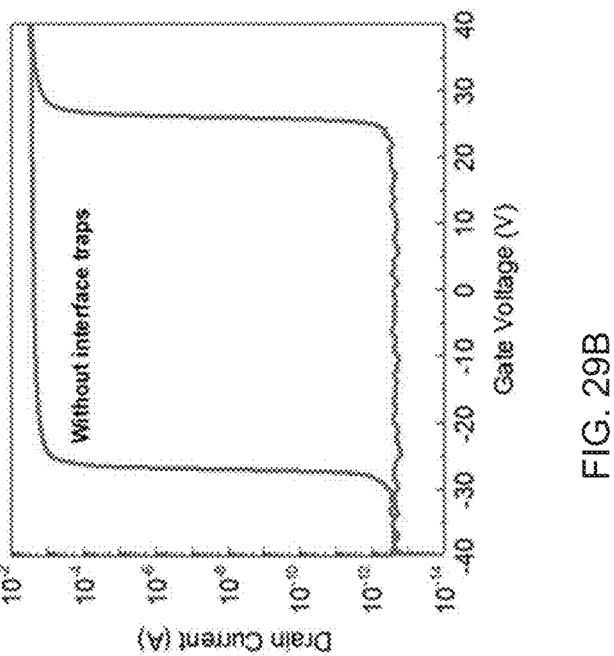
FIGS. 29A-29B illustrate impacts of interface traps on FeFETs memory window.
Figure 29A:
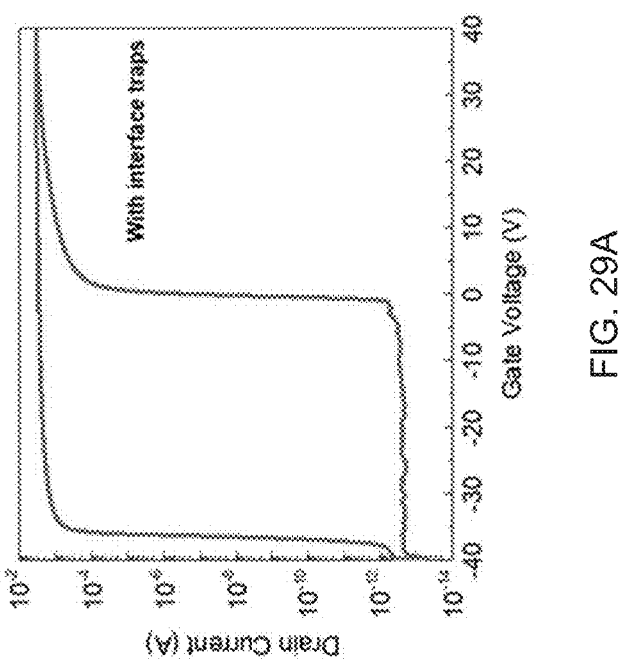

FIGS. 29A-29B illustrate the impacts of interface traps on FeFETs memory window. Semilogarithmic scale simulated transfer characteristics at room temperature of a representative AlScN/MoS2 FeFET with (FIG. 29A) and without (FIG. 29B) interface traps. The FeFET comprises 100 nm AlScN as the gate ferroelectric dielectric with a MoS2 channel thickness of 10 nm, a channel length of 1 μm and traps density of $1\times10^{14}/cm^2$. This simulation presents the difference between experimental and simulated results is due to the presence of trapped charge in the dielectric stack of the FeFET. Trap charges are expected to produce clockwise hysteresis in an FeFET while Fe-polarization switching produces counterclockwise hysteresis. This is also clearly evident in FIG. 3 where we have made comparisons with non-FE AlN dielectric based transistors.

Figure 30B:
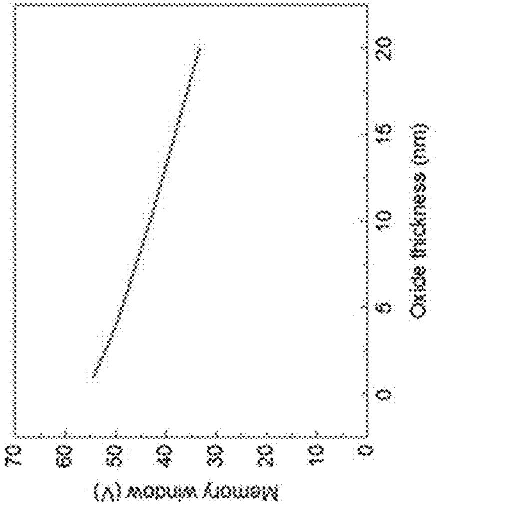
FIGS. 30A-30B illustrate impacts of interface oxide on FeFETs memory window.
Figure 30A:

FIGS. 30A-30B illustrate impacts of interface oxide on FeFETs memory window. (FIG. 30A) The TCAD simulated low (high) threshold voltages versus thickness of a non-ferroelectric oxide on ferroelectrics in the proposed AlScN/MoS2 FeFETs. (FIG. 30B) The extracted memory window from TCAD simulation versus thickness of a non-ferroelectric oxide on ferroelectrics in the proposed AlScN/MoS2 FeFETs. The results show that the sub-5 nm native oxide in our demonstrated FeFETs don't play a critical role in the memory operation.

Figure 31:
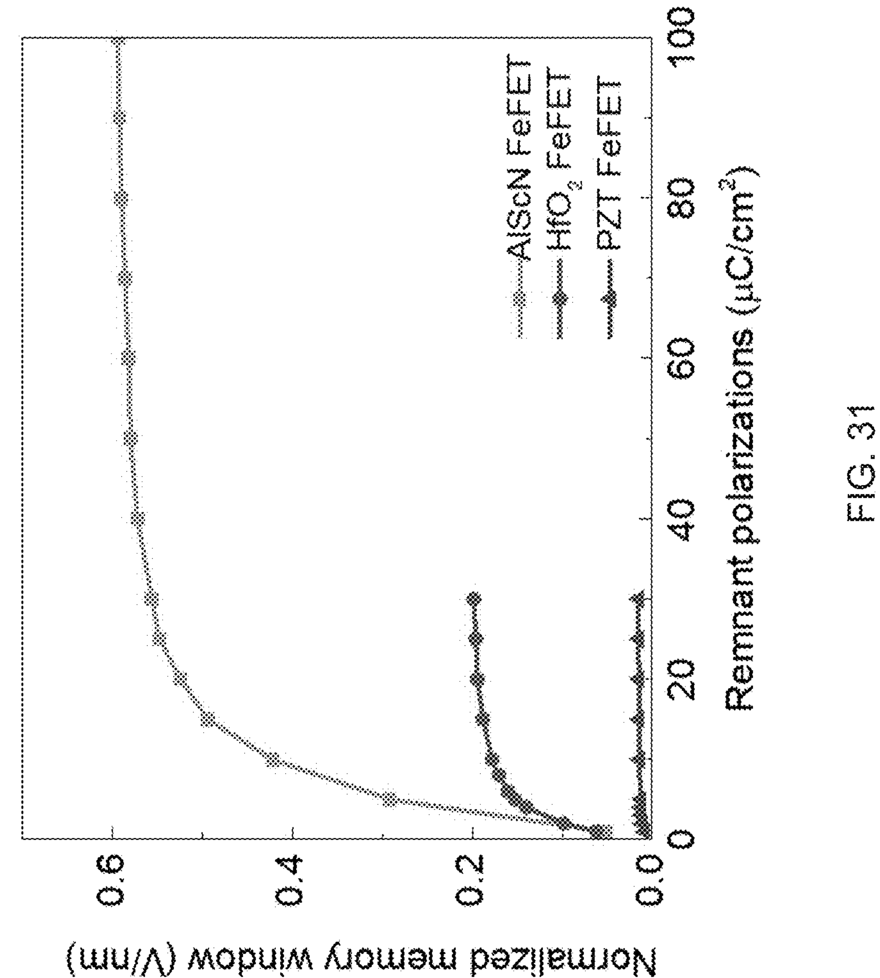
FIG. 31 illustrates TCAD simulated normalized memory window in AlScN, HfO2 and PZT FeFETs.

FIG. 31 provides a TCAD simulated normalized memory window in AlScN, HfO2 and PZT FeFETs. The larger normalized memory window indicates a thinner ferroelectric required to maintain same absolute memory window.

FIGS. 32A-32E illustrate a process flow for constructing Fe-FETs on CMOS. (FIG. 32A) Start with a foundry CMOS die with a top metal etch stop layer. (FIG. 32B) Remove the Polyimide and PSG encapsulation followed by removal of the metal etch stop to present a smooth flat surface. (FIG.

Figures 32A, 32B, 32C, 32D, 32E:
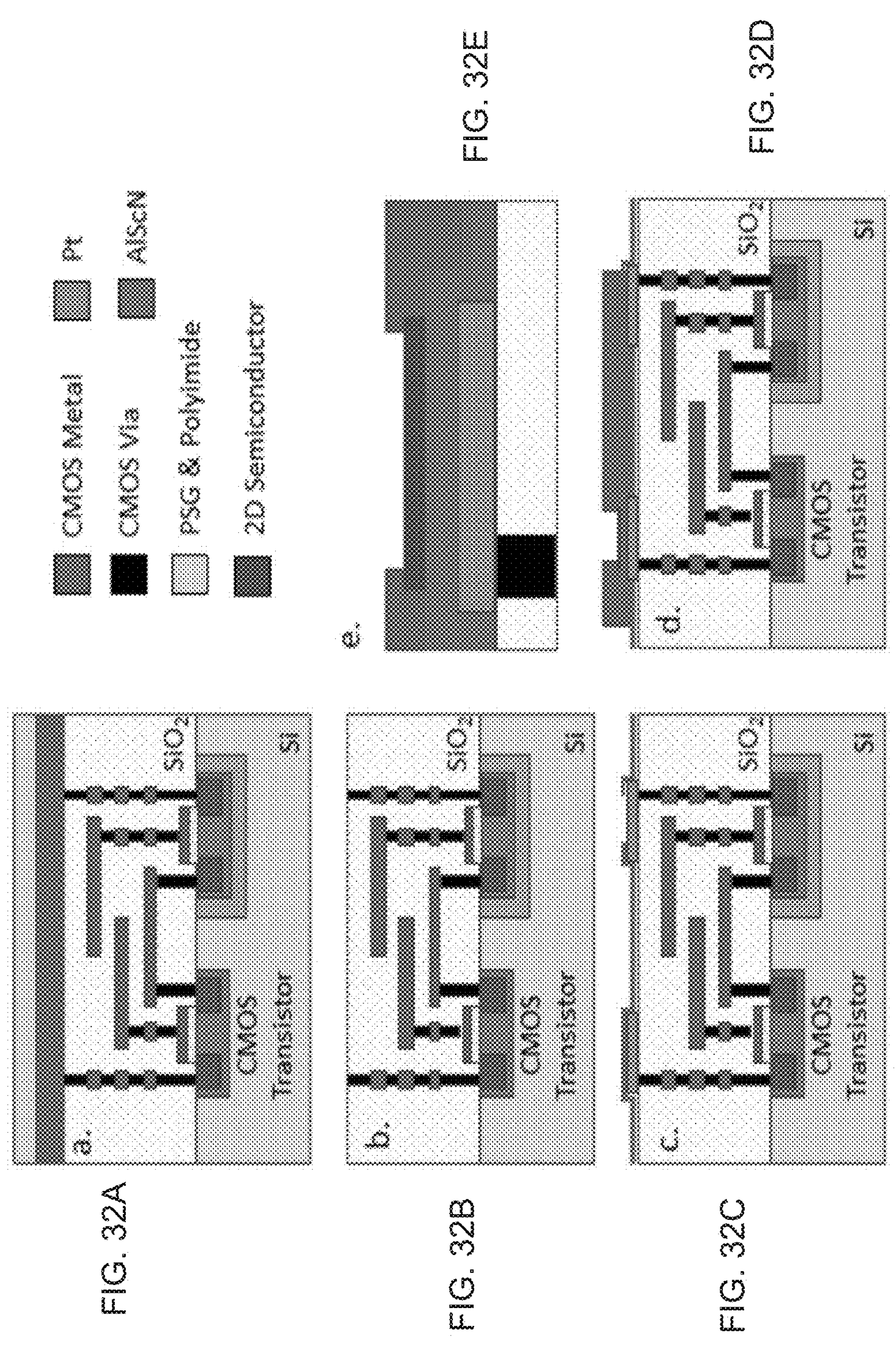
FIGS. 32A-32E illustrate a process flow for constructing Fe-FETs on CMOS.

32C) Deposited and pattern Pt followed by the deposition and patterning of AlScN ferroelectric material via KOH etching. (FIG. 32D) Layer transfer and pattern a 2D semiconductor on the AlScN and pattern and etch FeFET source and drain metal contacts. (FIG. 32E). Zoom in of the layers in the Fe-FET.

Figure 33:
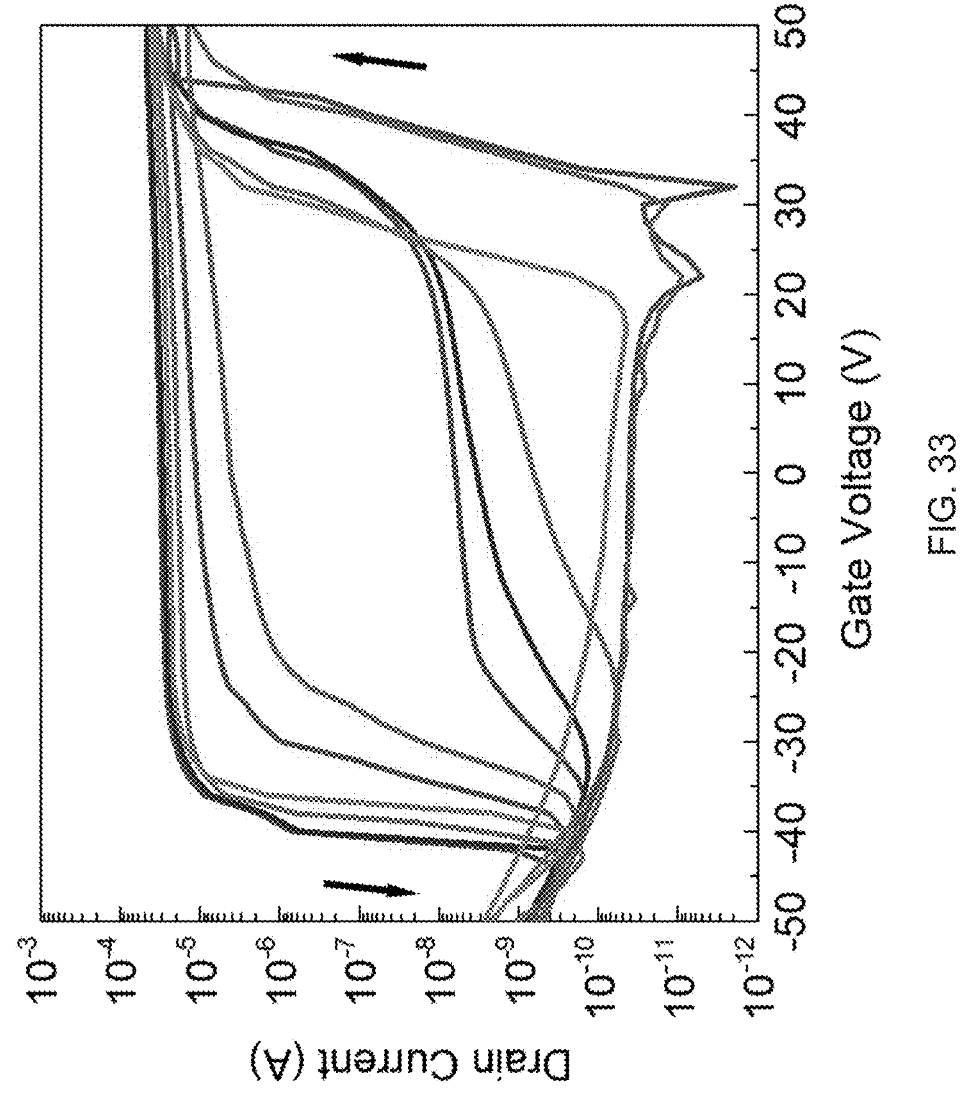
FIG. 33 illustrates transfer curves of various AlScN/MoS2 FeFETs.

FIG. 33 illustrates transfer curves of various AlScN/MoS2 FeFETs. The channel lengths of all devices are ~1 um. The device to device variability in memory window is evident.

Figure 34:
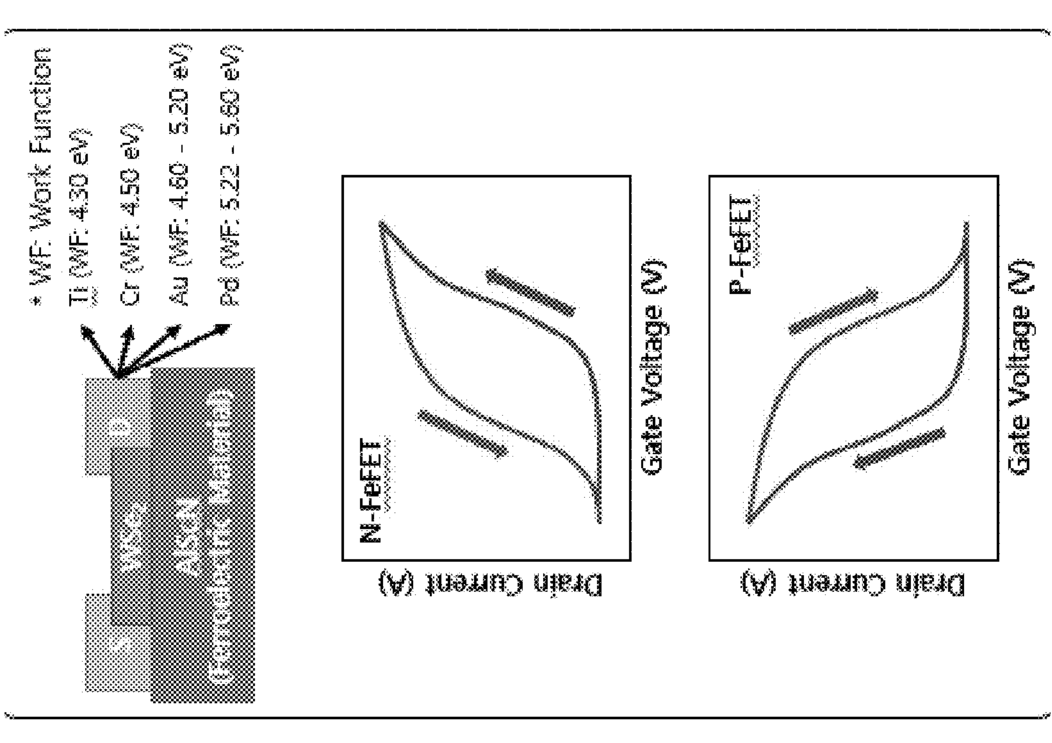
FIG. 34 provides a schematic illustration of a cross-section of $WSe_2$ FE-FET with AlScN ferroelectric dielectric and a metal back gate.

FIG. 34 provides a schematic illustration of a cross-section of $WSe_2$ FE-FET with AlScN ferroelectric dielectric and a metal back gate. The source drain contacts can be engineering with various metals of varying work function to tune the polarity of the FE-FET (from P to N) as shown in the schematic I-V characteristics.

Figure 35:
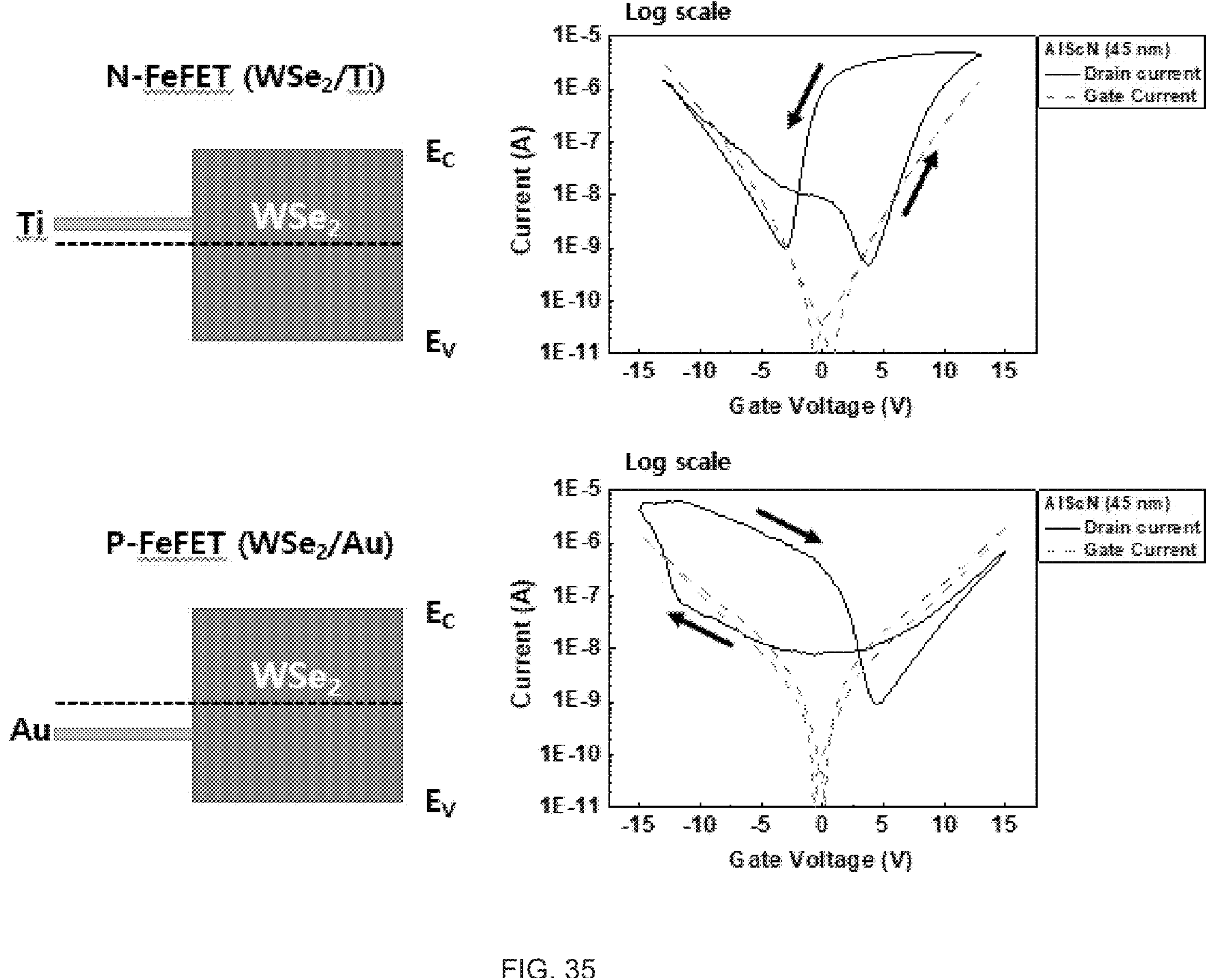
FIG. 35 provides band diagram illustrations for exemplary devices.

FIG. 35 provides (Left) Schematic illustration of band diagrams of contact-semiconductor channels in N and P polarity WSe2 FE-FETs with AlScN ferroelectric dielectric and a metal back gate. (Right) Transfer characteristics (Drain current vs gate voltage) (solid black lines) of N and P WSe2/AlScN FE-FETs showing counterclockwise and clockwise hysteresis attributed ferroelectric polarization switching. The dashed grey lines represent gate-leakage current.

Figure 36:
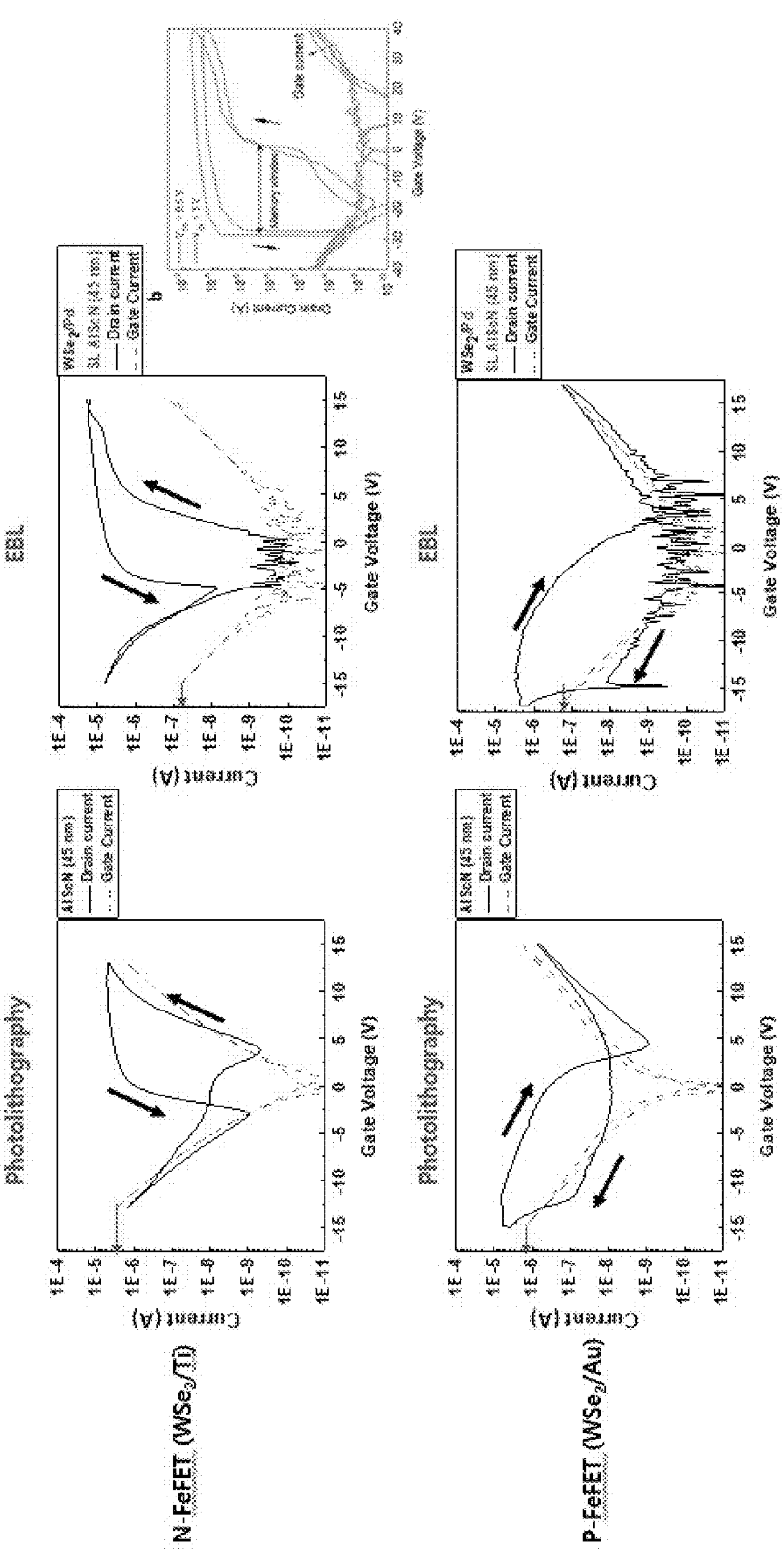
FIG. 36 provides transfer characteristics for exemplary devices.

FIG. 36 provides (Left) Transfer characteristics (Drain current vs gate voltage) (solid black lines) of N and P $WSe_2$/AlScN FE-FETs fabricated using photolithography showing counterclockwise and clockwise hysteresis attributed ferroelectric polarization switching. The dashed grey lines represent gate-leakage current. (right) Transfer characteristics (Drain current vs gate voltage) (solid black lines) of N and P WSe2/AlScN FE-FETs with e-beam lithography (EBL) showing counterclockwise and clockwise hysteresis attributed ferroelectric polarization switching. The dashed grey lines represent gate-leakage current which is much reduced in the EBL fabrication.

FIG. 37 provides a schematic illustration of a fabrication process for large areas 2D semiconductor channel/AlScN based FE-FETs with AlScN ferroelectric dielectric and a metal back gate.

Figure 38:
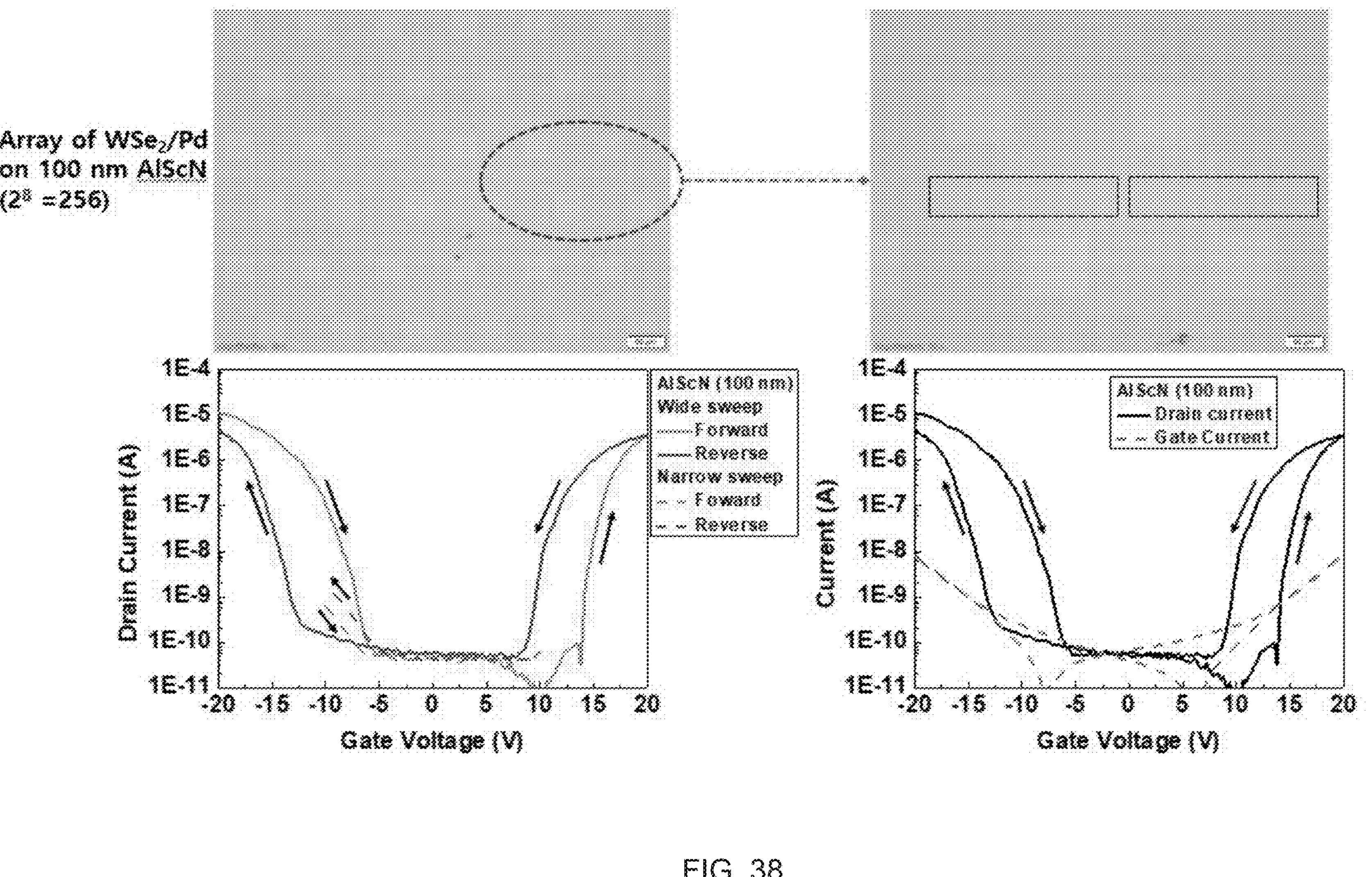
FIG. 38 provides (Top) optical micrographs of an array of WSe2/AlScN FE-FETs (Bottom) Transfer characteristics (drain current vs gate voltage) of ambipolar WSe2/AlScN FE-FETs which show counter clockwise hysteresis loops for positive voltages and clockwise hysteresis loops for negative voltages. This is the first demonstration of an ambipolar 2D channel FE-FET.

FIG. 38 provides (Top) optical micrographs of an array of WSe2/AlScN FE-FETs (Bottom) Transfer characteristics (drain current vs gate voltage) of ambipolar WSe2/AlScN FE-FETs which show counter clockwise hysteresis loops for positive voltages and clockwise hysteresis loops for negative voltages. This is the first demonstration of an ambipolar 2D channel FE-FET.

FIG. 39 provides (Left) optical micrograph of an array of WSe2/AlScN FE-FETs fabricated on AlScN coated wafers. (Right) Transfer characteristics (drain current vs gate voltage) of ambipolar WSe2/AlScN FE-FETs which show counter clockwise hysteresis loops for positive voltages and clockwise hysteresis loops for negative voltages for several devices.

Figure 40:
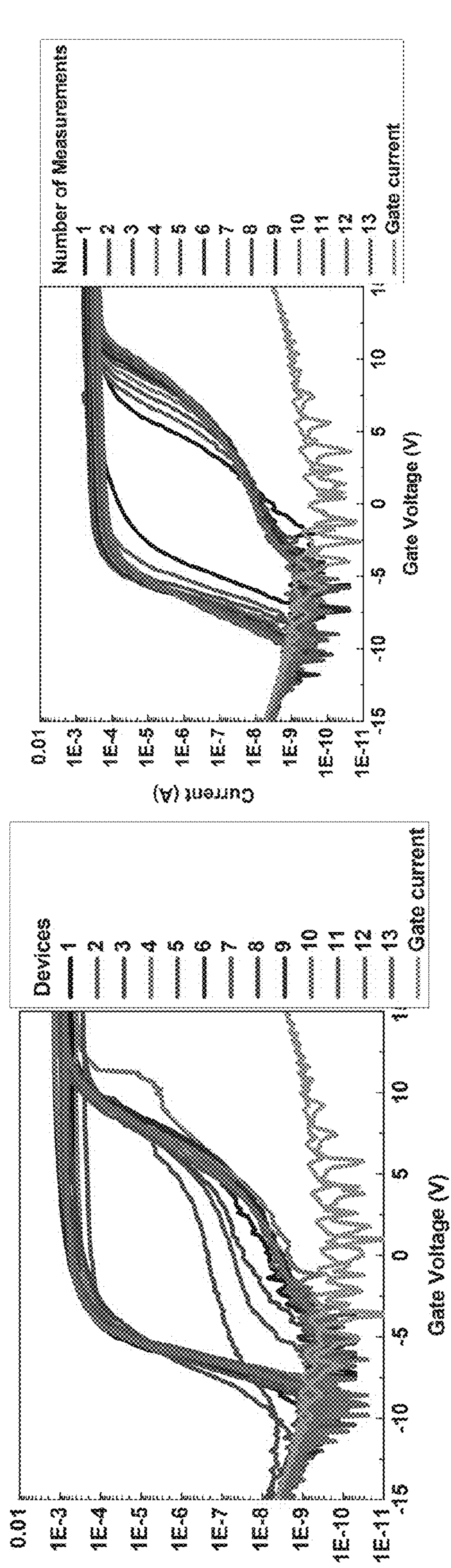
FIG. 40 provides transfer characteristics (drain current vs gate voltage) of an array of n-type MoS2/AlScN FE-FETs with Ti/Au contacts on 100 nm AlScN (32% Sc) showing high yield, stable memory window and reproducible electrical behavior from device to device (left) and from sweep to sweep (right) for the same device, showing the device's value for both scalable and reliable memory technology.

FIG. 40 provides Transfer characteristics (drain current vs gate voltage) of an array of n-type MoS2/AlScN FE-FETs with Ti/Au contacts on 100 nm AlScN (32% Sc) showing high yield, stable memory window and reproducible electrical behavior from device to device (left) and from sweep to sweep (right) for the same device showing the device's value for both scalable and reliable memory technology.

Example Disclosure-I

By using AlScN as a ferroelectric, one can form practical FeFET devices. AlN alloyed with Sc shows relatively large coercive fields, $E_c$, of 2-4.5 MV/cm, which in turn allows for scaling to thinner ferroelectric layers and smaller FeFET gate dimensions while also maintaining a large memory window. When combined with the high remnant polarizations, $P_r$, of 80-115 μC/cm$^2$, this further leads to scaling of the bit density of FeFETs. The comparatively low deposition temperature (≤350 deg. C.) of AlScN allows for FeFET integration directly in a CMOS BEOL.

The present disclosure provides—for the first time—a demonstration of AlScN integrated FeFETs that utilize a molybdenum disulfide ($MoS_2$) channel, the devices being fabricated in a BEOL, CMOS-compatible process on Si. With 100-nm-thick AlScN as a ferroelectric gate dielectric, the resulting devices offer high performance. As an example, devices were formed with a large memory window, e.g., in a range of 20 to 40 V, a high on/off ratio of, over $10^6$, and a maximum on-current of 3 mA for a device with channel dimensions W/L=12 μm/3 μm.

Without being bound to any particular theories or embodiments, the disclosed approach allows for the formation of devices at relatively low temperatures (e.g., 350 deg. C.), which allow the devices to be formed at the back end of the semiconductor line (BEOL). This is important in that it allows for the fabricator to form at the front end of the line a layer of computational devices and the at the back end of the line form the memory devices, stacked on top of the computational devices. This makes for a space-efficient design, as the memory devices then need not consume any space in the layer of computational devices. Further, the close proximity to computation devices also enables high speed, local memory access.

Second, the inventive devices are relatively thin and have a comparatively large memory window, which can be expressed in terms of V/nm. Further, the inventive devices exhibit a desirable counterclockwise hysteresis loop, in terms of current vs. voltage.

Ferroelectric Film Deposition and Device Fabrication

An AlScN film was co-sputtered from two separate 4-inch Al (1000 W) and Sc (450 W) targets in an Evatec CLUSTERLINE® 200 II pulsed DC Physical Vapor Deposition System. The deposition was done at 350° C. with Ar/$N_2$ gas flow of 6/12 sccms respectively. This yields a stress of −569 MPA, a surface roughness of 1.30 nm and a rocking curve FWHM of 4.1 degrees. X-TEM of AlScN are shown in FIGS. 1A and 1B. FIG. 2 shows a schematic of the experimental AlScN/$MoS_2$ FeFET in both the On-State and the Off-State.

With polydimethylsiloxane (PDMS) assisted dry stamp transfer, the mechanically exfoliated $MoS_2$ layers were transferred on top of the AlScN layer. Electrical contacts were fabricated by using e-beam lithography, followed by the deposition of Ti/Au (20 nm/50 nm) metal contacts. The patterned samples were cleaned using an $O_2$ plasma (10 s at 50 W) before the metal electrode deposition step to remove any potential residues. After lift-off, the devices were annealed for 10 mins at 300° C. under an atmosphere of Ar and $H_2$ before electrical characterization.

Exemplary Results and Discussion

Representative transfer and output characteristics of the fabricated AlScN/$MoS_2$ FeFETs are shown in FIGS. 3A and 3B, respectively. The on/off ratio of the fabricated AlScN/$MoS_2$ FeFETs is ~$10^6$, and the maximum on-current is as high as 3 mA in the channel with W/L=12 μm/3 μm, which (without being bound to any particular theory) is attributed to the high polarization in the ferroelectric AlScN films, implying superior scalability of the bit density in an AlScN-based memory.

The large counterclockwise hysteresis loop measured in AlScN/MoS2 FeFETs indicates that the ferroelectric polarization is dominating channel conduction for large counterclockwise gate voltage sweeps. A negligible hysteresis loop is observed for clockwise voltage sweeps over a smaller sweeping window induced by the traps. (FIG. 4). Charge traps in dielectrics are also known to produce hysteresis loops in transfer characteristics. However, trap-induced loops are only clockwise in their directionality.

The observation of a counterclockwise ferroelectric loop suggests (without being bound to any particular theory) existence of ferroelectricity and polarization switching. The normalized memory window at VDS=1 V, divided by the thickness of the ferroelectric film, is 40 V/100 nm, which is the highest value ever reported for a FeFET at room temperature, to the best knowledge, as shown in Table I below:

TABLE I

| Comparative data | | |
|---|---|---|
| Reference | Memory window/ ferroelectric thickness | On/Off ratio |
| Zr-doped $HfO_2$ [2] | MV~0.5 V/10 nm | $10^4$ |
| A-doped $HfO_2$ [3] | MV~2 V/16 nm | 10 |
| P(VDF-TrFE) [4] | MV~25 V/300 nm | $10^4$ |
| PZT [5] | MV~5 V/100 nm | $10^3$ |
| This work | MV~40 V/100 nm | $10^6$ |

Theoretical analysis of the FeFETs and device-level simulations was conducted by Sentaurus TCAD to investigate the counterclockwise hysteresis, and the projection of the memory window on a 13 nm AlScN was analyzed to be twice the memory window on HfZrO with the same thickness. This enables scaling to thinner ferroelectric layers that are critical in the FeFET for lowering the voltage required to polarize the gate dielectrics.

Example Disclosure-II

Recent advances in oxide ferroelectric (FE) materials have rejuvenated the field of low-power, non-volatile memories and made FE memories a commercial reality. Despite these advances, progress on commercial FE-RAM based on lead zirconium titanate has stalled due to process challenges. The recent discovery of ferroelectricity in scandium doped aluminum nitride (AlScN) presents new opportunities for direct memory integration with logic transistors due to the low temperature of AlScN deposition (approx. 350° C.) making it compatible with back-end-of-the-line integration on Silicon logic. Here, we present a FE-FET device composed of an FE-AlScN dielectric layer integrated with a two-dimensional MoS=channel. The disclosed devices show an ON/OFF ratio ~$10^6$, concurrent with a normalized memory window of 0.3 V/nm. The devices also demonstrate stable memory, e.g., up to 104 cycles and state retention up to 105 seconds. These results show that the FE-AlScN/2D combination is ideal for embedded memory and memory based computing architectures.

Although ferroelectric random-access memory (FE-RAM) is an extant commercial technology, the device architecture requires an FE capacitor to be connected in series with a transistor. Further, the readout of a FE-RAM cell overwrites the FE capacitor by switching its polarity to extract the read current signal. The Fe-FET overcomes the above challenges. However, several persistent challenges have prevented the creation of scalable and durable FE-FETs.

the lack of a ferroelectric material with sufficiently large coercive field and remnant polarization the incompatibility of viable ferroelectric dielectrics with standard CMOS processing poor retention due to both the large depolarization fields Here, we demonstrate a high-performance FE-FET that integrates an atomically thin, two-dimensional (2D) molybdenum disulfide ($MoS_2$) channel on top of an AlScN dielectric. The devices achieve an ON/OFF ratio ~$10^6$ between the two memory states of "0" and "1". The AlScN dielectric is deposited onto a Si substrate at temperatures below 350° C., making the process compatible with back-end-of-the-line (BEOL) CMOS integration. We build upon recent reports showing that the remnant polarization ($P_r$) of AlScN can be very high (80-115 μC/cm$^2$) when Sc concentrations exceed 27%. The key advantage of the high remnant polarization is that the instabilities induced by both charge trapping and leakage currents through the ferroelectric insulator do not significantly affect the FE-FET device performance. Also, the higher coercive fields exhibited by AlScN (2-4.5 MV/cm) is effectively immune to the depolarization fields for a given polarization, which helps achieve long retention times and reduce read-disturb. While a larger Ec also means a larger write field, this should not be an issue as long as the ferroelectric thickness can be scaled down without inducing significant leakage. Ultimately, a large coercive field is useful to prevent against random bit-flip errors and read-disturb. We also note that van der Waals 2D semiconductors such as $MoS_2$ can be transferred onto arbitrary substrates at room temperatures via wet or dry transfer schemes It is also worth noting that although FE-FETs from 2D channels such as $MoS_2$ have been demonstrated and AlScN is a known ferroelectric dielectric, there are no FE-FET demonstrations using AlScN in part because growth of columnar, well-oriented FE-AlScN does not occur on Si or other mature semiconductors. Therefore, to evaluate AlScN's performance in an FE-FET one needs to transfer or deposit a high-quality semiconductor on as grown FE-AlScN and 2D semiconductors such as $MoS_2$ are ideal in this regard. Further, the $P_r$ value of FE-AlScN is quite high as compared to other known FE dielectrics. The impact of such high $P_r$ on any semiconducting channels is untested and therefore using 2D semiconducting channels which present the ultimate limit in carrier density modulation and inducing depolarization field is something that our work accomplishes and adds constructively to the body of knowledge on both 2D FETs and FE-FETs. Finally, the 2D channel combined with large Pr ferroelectric presents an ideal scenario for long retention in FE-FETs which is a long-standing goal for this device technology and our work aims to take a stepping stone in that direction. The above arguments combined with the CMOS compatibility of AlScN suggests that our approach could lead to a new generation of scalable, high-performance, and low-power memory devices compatible with Si CMOS processors.

Structure of $MoS_2$ FE-FETs with Ferroelectric AlScN

Figure 16A:
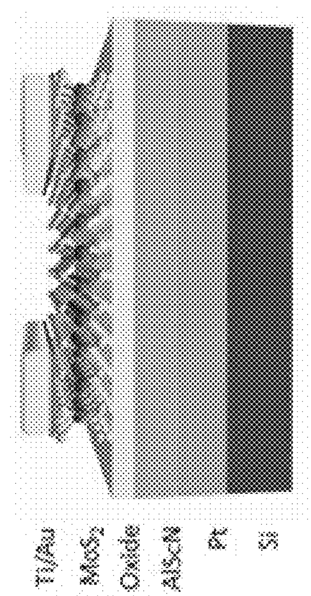
FIGS. 16A-16D provide data related to Multilayer $MoS_2$ FE-FETs with 100-nm-thick AlScN ferroelectric.
Figure 16B:
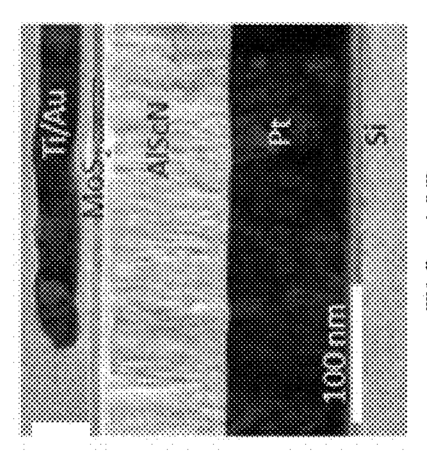
Figure 16C:
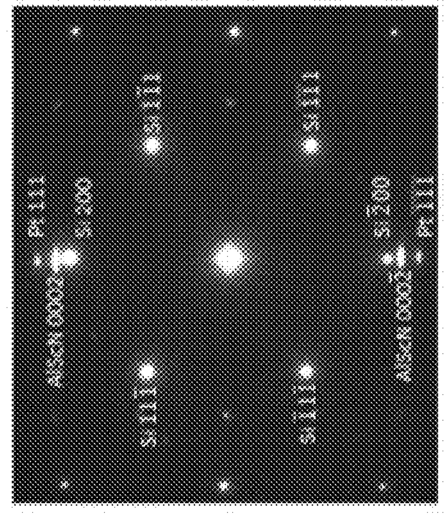
Figure 16D:
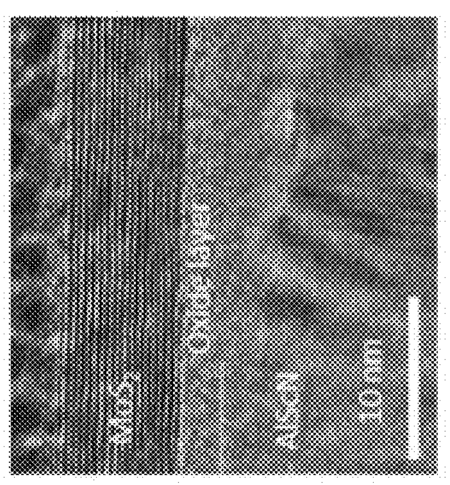

The AlScN/$MoS_2$ FE-FETs are bottom gated transistors with 100 nm thick $Al_{0.71}Sc_{0.29}N$ grown by sputter deposition on 100 nm thick Pt template (FIG. 16A) that was deposited on a heavily doped Si (100) wafer (see methods in supporting information for details). A cross-sectional bright-field transmission electron microscopy (TEM) image of a representative AlScN/$MoS_2$ FE-FET is shown in FIG. 16B. (See FIG. 22 for elemental analysis). The corresponding selected area electron diffraction (SAED) image pattern shows that the ferroelectric AlScN is highly crystalline and textured along the (0001) growth direction, evident in the arc of the 0002 reflection (FIG. 16C). A high-resolution phase-contrast TEM image of the AlScN/$MoS_2$ interface is shown in FIG. 16D, and the few-layer $MoS_2$ channel layer is clearly visible. A thin oxide layer is also observed on the top surface of AlScN. The thin (<5 nm) doesn't play a critical role in the switching of the FE-AlScN in the demonstrated FE-FETs.

Performance of AlScN/$MoS_2$ FE-FETs

Figures 17A, 17B, 17C, 17D, 17E, 17F:
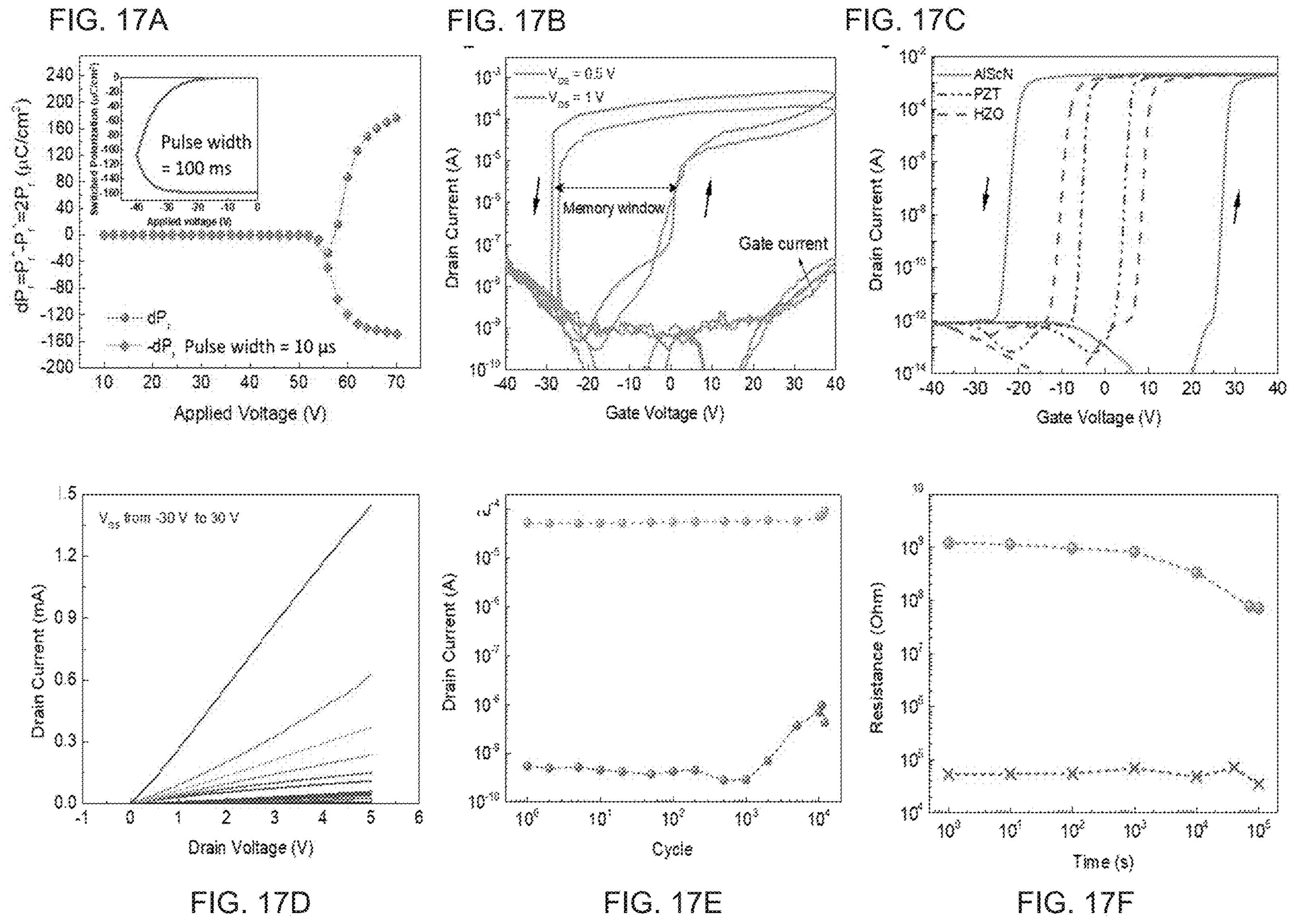
FIGS. 17A-17F provide room-temperature electrical characterization of AlScN/MoS2 FE-FETs.

The ferroelectric response of the 100 nm AlScN thin film was characterized by a positive-up, negative-down (PUND) measurement using a 10 μs square wave with a 1 ms delay between the two pulses (FIG. 23A), as shown in FIG. 17A. The PUND test was preferred over a polarization-electric field hysteresis loop (P-E loop) because the P-E loop of 100 nm AlScN shows a polarization dependent leakage which hinders the observation of polarization saturation in the positive field side, (FIG. 23C) The PUND result indicates a remanent polarization ~80 $\mu C/cm^2$ in the AlScN film and the onset of ferroelectric switching is over 50 V for a 10 μs pulse. Since the coercive voltage of a ferroelectric thin-film can be associated with the frequency (or pulse width) of the applied voltage, another PUND test using monopolar triangular wave with a 100 ms pulse width and a zero-to-peak voltage of 40 V was conducted and is presented as the inset of FIG. 17A (See also FIG. 23B). This PUND measurement indicates the same remanent polarization ~80 $\mu C/cm^2$ and a switching voltage between 30-40 V under the conditions similar to the device measurement and simulations. The formation of a native oxide on the surface of the FE-AlScN also gives an opportunity to fabricate MIM capacitor devices with the FE layer forming a leaky dielectric while the thin-oxide as an insulating tunnel barrier layer. A non-volatile resistive switching in form of ferroelectric tunnel junction at an applied DC voltage of 30-40 V was also observed, which serves as complementary evidence in support of ferroelectric switching (FIGS. 24A-24C).

In addition to standard current-voltage measurements, hysteresis between transfer characteristics was measured for the FE-FETs along two different sweep directions: i. forward (from low to high current i.e. negative to positive gate-voltage) and ii. reverse (from high to low current and positive to negative gate voltage) gate voltage sweeps at two different drain voltages (FIG. 17B). The application of a positive gate bias results in a sharp increase of drain current by several orders of magnitude associated with strong electron accumulation and a remanent on-state current after bringing the bias back to the read voltage window. The transistor shows an n-type characteristic due to the n-doping induced by the presence of sulfur vacancies in $MoS_2$.

Upon switching from positive bias to negative gate bias, a gentle decline in current followed by a precipitous drop at ~−30 V is observed. This suggests channel depletion and a remanent off-state current. The drain current after reaching depletion (off-state) closely mimics the gate current, which indicates that it is due to leakage from the gate-insulator. The measured ON/OFF current ratios of the reported devices are ~$10^6$. Without being bound to any particular theory, one can speculate that the source of this leakage current is likely due to the large areas of contact pads and global back gate combined with imperfections in the AlScN film or underlying Pt which can be minimized by using a local gate geometry or use of additional insulating layer underneath the probe contact pads in our devices.

The hysteresis in the reported transfer curves is significant and counterclockwise in its directionality, consistent with FE-FET theory. Charge trapping in dielectrics is also known to produce hysteresis loops in transfer curves. However, trapping-induced hysteresis loops are only clockwise in their directionality. Hence, our observation of a counterclockwise ferroelectric loop suggests the existence of ferroelectricity and polarization switching. With 100-nm-thick AlScN as a ferroelectric dielectric, the resulting AlScN/$MoS_2$ FE-FETs exhibit a large memory window ~35 V. The normalized memory window at a drain voltage of 1 V, divided by the thickness of the ferroelectric film, is 0.3 V/nm. This large normalized memory window is attributed to the desirable ferroelectric properties of AlScN: large coercive field, high polarization and moderate dielectric constant. We also performed technology computer-aided design (TCAD) simulations to investigate the dependence of memory window on the ferroelectricity of the gate dielectric, by adopting the FE parameters of traditional Lead Zirconium Titanate (PZT), doped Hafnium Oxide ($HfO_2$), and AlScN (Table II). As shown in the simulation results in FIG. 17C, counterclockwise transfer curve hysteresis loops are observed in all three FE-FETs with $MoS_2$ channels and with 100 nm thick gate dielectrics with the largest memory window for AlScN. We note that the memory windows in simulated $I_D$-$V_G$ curves in FIG. 17D are symmetric about $V_G$=0 V while the experimentally measured transfer characteristics of the device have been shifted left in comparison. We attribute this to traps at the interface of the semiconductor and in the AlScN dielectric as well as the surface oxide (See Supporting information S10 for details).

To further characterize the channel properties, output characterisitics (drain current-drain voltage) of AlScN/$MoS_2$ FE-FETs were measured. They show a linear behavior with a large degree of current control (current ratio of $10^4$) up to a high drain bias of 5 V and a large drive current density of over 100 μA/μm in the ON State. This ON current density is comparable with some of the highest current density values reported using electrical double layer dielectrics or ultrathin atomic layer deposition grown dielectrics. A maximum drain current over 1.4 mA is achieved with 100-nm-thick AlScN ferroelectric and a channel length of 3.2 μm. To further determine the memory effect and reliability, we performed cycling and time varying retention tests between the ON/OFF states as shown in FIG. 17E, 17F. FIG. 17E presents remanent ON-state and OFF-state currents extracted from 12,000 cycles. Cyclic program/erase operations of the same AlScN/$MoS_2$ FE-FET indicate that the both ON- and OFF-current states are stable and rewritable and do not show appreciable degradation upto 10,000 cycles. Readouts at various delay times were carried out to determine retention (FIG. 17F). The low and high current/resistance states can be retained for at least 100,000 secs at room temperature without significant degradation. We emphasize that a 2D channel is critical in achieving not only a high ON/OFF ratio but also long retention due to minimal depolarization field. The switching speed in the reported FE-FETs with 100 nm AlScN should be comparable to switching speed of <200 ns in 45 nm thick AlScN MIM capacitors as demonstrated in our recent study which also shows similar cycle endurance as observed in the FE-FETs presented here. A FE-FET is different as compared to an MIM capacitor and has additional parasitic elements in terms of contact and channel resistances. However, at our dielectric thicknesses (100 nm) and channel dimensions (>1 um) these factors are unlikely to be limiting the switching speed.

Comparison of AlScN/$MoS_2$ FE-FETs with Reference AlN/$MoS_2$ FETs

To further reinforce our observations from electrical measurements, we fabricated reference AlN/$MoS_2$ FETs. An AlN film of identical thickness to AlScN was sputtered in same system under same conditions. Then AlN/$MoS_2$ FETs with similar channel thickness and channel dimension were fabricated using the same process flow as the AlScN/$MoS_2$ FE-FETs. Transfer curves on both AlScN/$MoS_2$ FE-FETs and AlN/$MoS_2$ FETs with various sweep ranges are shown in FIG. 18. The hysteresis loops in the transfer characteristic, which depend strongly on gate voltage sweep range, serve as a strong evidence of ferroelectric polarization switching in AlScN/$MoS_2$ FE-FETs for DC measurements. As shown in FIG. 18A, the hysteresis in the AlScN/$MoS_2$ FE-FETs transfer curve is observed to reverse from clockwise to counterclockwise with the onset of polarization switching, which occurs at a higher gate voltage. For a small sweep range, the hysteresis is observed to be clockwise, indicating charge trapping is dominating the observed current hysteresis and that the ferroelectric polarization has not been reversed. For a large sweep range, the hysteresis is observed to be counterclockwise, indicating onset of polarization switching of the ferroelectric. As shown in FIG. 18B, $MoS_2$ FETs on 100 nm AlN show regular n-type behavior with ON/OFF $\sim 10^5$ similar to those made on oxide dielectrics. Significant hysteresis has also been observed, comparable to oxide dielectrics, but in the clockwise direction only. We attribute this to the trapped charge in the defects and dangling bonds in the dielectrics. Moreover, the hysteresis loop direction for the AlN dielectric FETs does not flip sign upon extension of the sweep range up to ±70 V (FIGS. 25A-25B). This further suggests that the counterclockwise hysteresis in AlScN/$MoS_2$ FE-FETs is induced by ferroelectric polarization switching.

Another striking observation is the difference in the magnitude of the ON current between the AlN/$MoS_2$ FETs and the AlScN/$MoS_2$ FE-FETs for similar channel dimensions, thicknesses and dielectric constants and dielectric thicknesses (FIG. 18C). Given that the k of AlScN (~12) is only ~1.7× greater than AlN (~7.1), a difference in ON current density by 400× is inexplicable by the standard dielectric capacitive charging model. This again suggests the presence of a high surface charge density in the semiconductor channel, which is induced by the ferroelectric polarization of AlScN. Beside the current magnitude, the comparative shift in threshold voltages of the transfer characteristics between AlN/$MoS_2$ FETs and AlScN/$MoS_2$ FE-FETs upon forward and reverse sweeps also suggests the presence of ferroelectric polarization in AlScN (FIG. 18C). For the forward sweeps (red), the shift in threshold voltage between AlScN/$MoS_2$ FE-FETs and AlN/$MoS_2$ FETs is 24 V, indicating additional negative charge at AlScN/$MoS_2$ interface. On the contrary, for the reverse sweeps (blue), the shift in threshold voltage between AlScN/$MoS_2$ FE-FETs and AlN/$MoS_2$ FETs is −19 V, indicating additional positive charge at the AlScN/$MoS_2$ interface. This change in sign of the charge at the AlScN/$MoS_2$ interface further verifies that the significant hysteresis induced in the transfer characteristics is a result of ferroelectric polarization switching. Finally, the dissimilarity of the subthreshold swing slope (SS) between AlN/$MoS_2$ FETs and AlScN/$MoS_2$ FE-FETs also indicates that the density of carriers in the channel is dominated by ferroelectric polarization switching.

As shown in FIG. 18C, the demonstrated $MoS_2$ FETs on AlScN exhibits steep slope-switching behavior (100 mV/dec) compared to the $MoS_2$ FETs on AlN of the same thickness (3000 mV/dec), reducing the subthreshold swing by 2 orders of magnitude. The abrupt and dramatic switching behavior displayed in the FIG. 18C is a direct effect of negative capacitance by integrating a ferroelectric layer into the gate. A consequence of negative capacitance, the FET device can operate with SS less than 60 mV/dec at room temperature in addition to exhibiting negative drain-induced barrier lowering (FIGS. 26A-26C and FIGS. 27A-27B) which further verifies our claim of FE switching.

Benchmarking and Discussion

The above results show that FE-AlScN and 2D $MoS_2$ channel-based FE-FETs are appealing. Combining a 2D channel with a BEOL compatible ferroelectric that has high remnant polarization is an interesting and unique combination for ultimately obtaining a long retention time remains a long-sought goal for FE-FETs as a technology, and the disclosed technology provides important progress. FIG. 19A shows a comparison of AlScN/$MoS_2$ FE-FETs with previously reported FE-FETs including traditional PZT FE-FETs and the state-of-the-art $HfO_2$ based FE-FETs. Si channels, 2D $MoS_2$ channels etc. have been used for the comparison. We have extracted the ON/OFF current ratio and a normalized memory window (memory window/ferroelectric thickness) from the reported transfer curves for a fair benchmarking. Normalization of the memory window to FE thickness is essential for the comparison, since all FE materials used and reported in the literature have varying thicknesses and because the memory window is proportional to the product of ferroelectric thickness and coercive field. FIG. 19A clearly indicates that AlScN/$MoS_2$ FE-FETs outperforms all previous FE-FETs in terms of normalized memory window and more importantly, AlScN/$MoS_2$ FE-FETs fulfill the two metrics (sufficient memory window and high ON/OFF current ratio) concurrently. Further, near room-temperature transfer of wafer scale CVD grown 2D semiconductors has also been achieved. Therefore, the device concept presented can be scaled up and utilized in CMOS BEOL applications among all the demonstrated FE-FETs.

While our reported FE-FETs are superior in terms of ON/OFF ratio and memory window, the endurance and retention are equally critical for a memory. One drawback that the FE-FET device concept has traditionally encountered is the depolarization of the ferroelectric layer over time due to the electrical field induced by incomplete charge compensation of the semiconducting channel.

To investigate depolarization field in the proposed AlScN FE-FET and its counterparts (PZT and $HfO_2$ FE-FET), we calculate the depolarization field/coercive field ($E_{dep}/E_c$) ratio in the FE-FETs. As shown in FIG. 19B, even for a scaled 10-nm AlScN ferroelectric layer, we derive an $E_{dep}/E_c$ ratio less than 1, indicating that the depolarization field does not exceed the coercive field for the ferroelectric layer. In contrast both $HfO_2$ and PZT based FE-FETs have $E_{dep}/E_c$ ratio of ~3 and ~40 respectively. This suggests that low-voltage scaling of AlScN/2D channel-based FE-FETs concurrent with long retention is attainable. Further In summary, we have shown high performance FE-FET based memory devices using AlScN FE dielectric combined with a 2D $MoS_2$ channel that exhibit a record normalized memory window and ON/OFF ratio concurrently with good retention and CMOS BEOL compatible processing temperatures. It should be understood that the AlScN dielectric combined with a 2D $MoS_2$ channel is illustrative only and that the disclosed technology is not limited to this illustrative embodiment.

Methods

Device Fabrication

We start by sputtering ferroelectric AlScN/gate stack on the top of Si wafer. A 100-nm-thick Pt film was deposited by sputtering onto a Ti seed on the top of Si (100) substrate. Next, a 100-nm thick ferroelectric AlScN film was co-sputtered from two separate 4-inch Al (1000 W) and Sc (450 W) targets in an Evatec CLUSTERLINE® 200 II pulsed DC Physical Vapor Deposition System. Pt templates the AlScN with registry along (0001) axis direction, yielding a highly textured FE dielectric. The Pt acts as the bottom gate electrode. The deposition was done at 350° C. with 6 sccm of Ar and 12 sccm of $N_2$ gas flow. This yields a stress of −569 MPa and a surface roughness of 1.3 nm (see FIGS. 21A-21B). For conventional AlN, the deposition was done at 350° C. with only 20 sccms of $N_2$ gas flow without utilization of the Sc target. A few-layer $MoS_2$ flake was mechanically exfoliated from bulk $MoS_2$ crystals (HQ graphene) using Scotch tape and then transferred onto a PDMS stamp. An optical microscope was used to locate uniform and thin $MoS_2$ flakes on the PDMS stamp.

$MoS_2$ flakes were then dry-transferred onto ferroelectric AlScN or AlN substrates using the PDMS stamp as transfer medium. Electrical contacts were patterned onto $MoS_2$ flakes using standard electron-beam lithography. Firstly, PMMA e-beam resist (MicroChem 495 A8) was spin-coated (4000 rpm for 80 seconds) onto the the p++ Si/Pt/AlN or p++Si/Pt/AlScN wafers followed by baking on a hot plate at 180° C. for 10 min. Second, we used e-beam lithography to define the source/drain regions in the PMMA layer followed by development using MicroChem's developer (MIBK:IPA (1:3)).

The patterned samples were then cleaned using an $O_2$ plasma (10 s at 50 W) before the metal electrode deposition step to remove any potential residues, followed by e-beam evaporation of Ti/Au film (10 nm/40 nm) and lift-off processes.

Device Characterization

Electrical measurements were performed in air at ambient temperature in a Lakeshore probe station using a Keithley 4200A semiconductor characterization system. The ramp rate for transfer measurements was >11000 mV/sec. AFM characterizations were performed using an AIST-NT SPM SmartSPM™-1000 which was done in the tapping mode with a 200 kHz resonance frequency. P-E hysteresis loops and PUND measurements of ferroelectric AlScN were conducted using a Radiant Precision Premier II (Radiant technologies, Inc., Albuquerque, NM) testing platform. The cross-section TEM sample was prepared in a FEI Helios Nanolab 600 focused ion beam (FIB) system using the in-situ lift-out technique. The sample was first coated with a thin carbonaceous protection layer by writing a line on the surface with a Sharpie® marker. Subsequent electron beam and ion beam deposition of Pt protection layers were used to prevent charging and heating effects during FIB milling. At the final cleaning stage, a low-energy Ga+ ion beam (5 keV) was used to reduce FIB-induced damage. TEM characterization and image acquisition were carried out on a JEOL F200 TEM operated at 200 kV accelerating voltage. Image analysis and feature extraction were performed using ImageJ. All quantification results presented in this work were calculated with Digital Micrograph software (DM, Gatan Inc., USA).

Simulations

Physics-based self-consistent FE-FETs current-voltage characteristics simulation was performed using Synopsys Sentaurus TCAD, by coupling Poisson's equation, the Ginzburg-Landau equation and the 2D charge conservation equation.

TABLE II

Benchmarking and comparison of the ferroelectric AlScN with tradional perovskite oxide ferroelectric lead zirconium titanate (PZT) and ferroelectric $HfO_2$.

| Ferroelectrics | PZT | $HfO_2$ | AlScN |
|---|---|---|---|
| Remnant Polarization (μC/cm²) | 20-30 | 1-30 | 80-115 |
| Coercive Field (MV/cm) | 0.05 | 1-2 | 2-5 |
| Dielectric Constant | 450-1250 | 15-25 | 10-20 |
| Max. Processing Temperature (° C.) | >600 | 450-1100 | <400 |

AlScN shows large coercive fields, $E_c$, of 2-4.5 MV/cm, which enables scaling to thinner ferroelectric layers and smaller FeFET gate dimensions while maintaining a large memory window. When combined with the high remnant polarizations, this leads to scaling of the bit density and ensures a high retention time of FeFETs against depolarization field. The low deposition temperature below 350° C. of AlScN without the need for a high-temperature annealing allows for FeFET integration directly in a CMOS BEOL process.

TABLE III

Key parameters of TCAD simulaton for FeFETs.

| FeFET Ferroelectrics | PZT | $HfO_2$ | AlScN |
|---|---|---|---|
| Remnant Polarization (μC/cm²) | 30 | 30 | 100 |
| Coercive Field (MV/cm) | 0.05 | 1 | 3 |
| Dielectric Constant | 450 | 20 | 15 |
| $MoS_2$ Channel Thickness (nm) | 10 | 10 | 10 |
| Channel Length (μm) | 1 | 1 | 1 |
| Channel Width (μm) | 1 | 1 | 1 |

Impact of Charge Traps on FE-FET Characteristics

The leftward shift in the FE-FET transfer characteristics due to trap charges has been verified using TCAD simulations (FIG. 29 below). The presence of charge traps both in the ferroelectric and the resulting native oxide are expected since the as grown AlScN is N-polar and therefore the surface charges of the AlScN ferroelectric upon exposure to air are expected to react and form oxides as well as contain trapped charges.

Impact of Interfacial Oxide

The surface oxide while thin (<5 nm) certainly poses a challenge in obtaining a complete understanding of the ferroelectric-2D interface. We note however, that this oxide layer does have significant impact on the transfer characteristics of our FE-FET devices based on our other recent publication on switching AlScN MIM capacitors without any surface or interface oxide. Further, to deduce the impact of the oxide, we have now performed additional simulations (see Supporting information S11) to understand the nature of a non-ferroelectric oxide on FE-FETs. Briefly, we have been able to determine that the naive oxide (<5 nm thickness) in our demonstrated FeFETs doesn't play a critical role in the fundamental memory operation. The oxide however may contain additional trapped charges whose impact has been discussed below.

Simulation of Normalized Memory Window and Depolarization in FE-FETs

We use a short circuit model together with the ferroelectric and dielectric parameters ($E_c$, $P_r$ and k) at DC frequency that describe the ferroelectrics. A 1-nm-thick interfacial insulator layer is assumed to model realistic depolarization properties in a FE-FET. For fair comparisons, the same remnant polarization value of 30 μC/cm$^2$ has been used in the calculation of the $E_{dep}/E_c$ ratio. This is because the memory window of the AlScN FE-FET saturates if we program $P_r$ beyond this polarization as shown below.

Benchmarking and Comparison with Other FE Dielectrics.

Although the larger coercive field implies higher write fields in theory, the shape of P-E loops of the FE dielectrics must be taken into account together with the coercive fields to determine the write fields. For ferroelectrics with non-ideal P-E loops such as PZT and HfO2, a write field much higher than the coercive field is usually needed to saturate the polarization states. The more square shaped (near-ideal) P-E loops of AlScN are expected to relieve these requirements of higher write fields as compared to the coercive fields. Besides the non-ideal P-E behavior, traditional perovskite oxide ferroelectrics such as lead PZT are incompatible with the BEOL, CMOS processing temperatures (~400° C.). Among oxide FE materials discovered to date, only doped $HfO_2$ had potential to be adopted in CMOS BEOL applications like monolithic 3D integration of memory interleaved with logic computation layers. However, a high temperature annealing (>400° C.) is necessary for most doped $HfO_2$ materials to crystalize and attain decent ferroelectricity. In comparison, AlScN can be deposited in a polycrystalline FE switching ready state at 350° C. on top of Si wafers as we have shown.

By assuming the same amount of incompletely compensated charge, the depolarization field in the ferroelectric is approximately inversely proportion to its thickness. Thus, theoretically, as the ferroelectric layer thickness scales down for low-voltage operation, the remnant polarization states will become unstable since the depolarization field becomes larger than the coercive field. This depolarization field has been the cause of severe retention loss in oxide-based FE-FETs, which has hindered further development of FE-FET memory based on them.

ASPECTS

The following Aspects are illustrative only and do not serve to limit the scope of the present disclosure or of the appended claims.

Aspect 1. A component, comprising: a portion of AlScN; a semiconducting channel portion, the channel portion being in electronic communication with the portion of AlScN, and the channel portion comprising a material characterized as a 2D material, a back-gate electrode in electronic communication with the portion of AlScN; a source electrode in electronic communication with the channel portion; and a drain electrode in electronic communication with the channel portion.

Aspect 2. The component of Aspect 1, wherein the channel portion is disposed on the portion of AlScN.

Aspect 3. The component of any one of Aspects 1-2, wherein the channel portion comprises a semiconducting metal dichalcogenide, a metal halide (non-limiting examples include, e.g., lead iodide or chromium iodide), or a Group IV (non-limiting examples include, e.g., silicene or germanene or stanene), Group V (non-limiting examples include, e.g., phosphorene—also known as black phosphorus, antimonene and arsenene), or a Group VI (non-limiting examples include, e.g., tellurene and selinene) elemental semiconductor.

Aspect 4. The component of Aspect 3, wherein the channel portion is characterized as comprising at least one monolayer of the semiconducting metal dichalcogenide, a metal halide, or a Group IV, V or VI elemental semiconductor. As an example, the channel portion can include a single layer (i.e., a monolayer) of the semiconducting metal dichalcogenide, a metal halide, or a Group IV, V or VI elemental semiconductor.

Aspect 5. The component of Aspect 3, wherein the semiconducting metal dichalcogenide comprises $MoS_2$, $WS_2$, $WSe_2$, $MoTe_2$, InSe, SnSe, GaSe, CrGeTe, black phosphorus, tellurene, arsenene, selenene or any combination thereof. Without being bound to any particular theory or embodiment, $MoS_2$ is considered especially suitable.

Aspect 6. The component of any one of Aspects 1-5, wherein the portion of AlScN defines a thickness in the range of from about 2 to about 50 nm. The thickness can be, e.g., from about 2 to about 50 nm, from about 3 to about 50 nm, from about 4 to about 50 nm, from about 5 to about 50 nm, from about 5 to about 30 nm, from about 10 to about 25 nm, and all intermediate values.

Aspect 7. The component of any one of Aspects 1-6, wherein the channel portion defines a thickness in the range of from about 0.5 to about 1.2 nm, e.g., from about 0.5 to about 1.2 nm, from about 0.6 to about 1.0 nm, or even from about 0.7 to about 0.9 nm.

Aspect 8. The component of any one of Aspects 1-7, wherein the component exhibits a memory window/thickness in the range of from about 0.05 to about 0.4 V/nm, e.g., from about 0.1 to about 0.4 V/nm, from about 0.15 to about 0.35 V/nm, from about 0.17 to about 0.31 V/nm, from about 0.19 to about 0.29 V/nm, from about 0.21 to about 0.28 V/nm.

Aspect 9. The component of any one of Aspects 1-8, wherein the component exhibits an on/off ratio of at least about 10. The on/off ratio can be, e.g., about (or at least about) 10, about (or at least about) $10^2$, about (or at least about) $10^3$, about (or at least about) $10^4$, about (or at least about) $10^5$, about (or at least about) $10^6$, about (or at least about) $10^7$, or even about (or at least about) $10^8$. The ratio can be, e.g., from about 10 to about $10^7$, or from about 10 to about $10^6$, or from about to about 10 to about $10^5$, or from about 10 to about $10^4$, or from about 10 to about $10^3$, or even from about 10 to about $10^2$.

Aspect 10. The component of any one of Aspects 1-9, wherein (a) the back-gate electrode contacts the AlScN portion, (b) the source electrode contacts the channel, (c) the drain electrode contacts the channel, or any combination of (a), (b), and (c).

Aspect 11. The component of any one of Aspects 1-10, wherein the component exhibits a counterclockwise hysteresis loop under a relatively larger gate voltage sweep of and a negligible hysteresis loop under a relatively smaller gate voltage sweep as compared to the relatively larger gate voltage sweep. Without being bound to any particular theory or embodiment, this is shown by exemplary FIG. 4 and FIG. 12 (left panel).

Aspect 12. The component of any one of Aspects 1-11, wherein the component defines a height of from about 10 to about 335 nm, e.g., from about 10 to about 335 nm, from about 20 to about 315 nm, from about 30 to about 305 nm, from about 40 to about 290 nm, from about 50 to about 280 nm, from about 60 to about 260 nm, from about 70 to about 250 nm, from about 90 to about 235 nm, from about 110 to about 205 nm, from about 135 to about 190 nm, or even from about 150 to about 170 nm. Again without being bound to any particular theory or embodiment, the following are exemplary ranges for the following device elements shown in FIG. 2.

Metal layer: From about 5 to about 200 nm in thickness, e.g., from about 5 to about 200 nm, from about 10 to about 180 nm, from about 15 to about 170 nm, from about 20 to about 160 nm, from about 35 to about 155 nm, from about 50 to about 125 nm, or even from about 60 to about 150 nm.

AlScN: From about 5 nm to 500 nm in thickness, e.g., from about 5 to about 500 nm, from about 5 to about 450 nm, from about 5 to about 400 nm, from about 5 to about 350 nm, from about 5 to about 300 nm, from about 5 to about 250 nm, from about 5 to about 200 nm, from about 5 to about 150 nm, from about 5 to about 100 nm, from about 5 to about 100 nm, from about 5 to about 50 nm, or even from about 5 to about 30 nm in thickness Channel portion: From about 0.5 to about 5 nm in thickness, e.g., from about 0.5 to about 4 nm in thickness, from about 1 to about 3 nm in thickness, or even from about 1 to about 2 nm in thickness.

Source and drain electrodes: From about 10 nm to 100 nm, e.g., from about 10 to about 100 nm, from about 15 to about 90 nm, from about 20 to about 80 nm, from about 25 to about 70 nm, from about 30 to about 60 nm, from about 35 to about 50 nm, or even about 40 nm. It should be understood that a device according to the present disclosure can be constructed of any combination of the foregoing element thickness ranges and specific thickness values, including any and all intermediate values.

Aspect 13. The component of any one of claims 1-13, wherein either one or both of the source electrode and the drain electrode independently comprises Ti, Cr, Au, or Pd. The source and drain electrodes can comprise the same metal, but this is not a requirement, as the source and drain electrodes can also be different metals.

Aspect 14. The component of any one of claims 1-13, wherein the component is characterized as an n-type device.

Aspect 15. The component of any one of claims 1-13, wherein the component is characterized as a p-type device.

Aspect 16. The component of any one of claims 1-13, wherein the component is characterized as ambipolar. As but one example of such devices, $WSe_2$/Pd on 100 nm AlScN results in an ambipolar device, as shown in FIG. 38. It should be understood, however, that ambipolar devices according to the present disclosure can be made with configurations other than $WSe_2$/Pd on 100 nm AlScN. For example, ambipolar devices can be made using noble metal contacts, e.g., Au, Pd, and/or Pt, and a variety of channel portion materials. (Example such materials are described elsewhere herein.)

Aspect 17. The component of claim 16, wherein the component is characterized as having two stable voltage-induced states at positive gate voltages, and wherein the component is characterized as having two stable voltage-induced states at negative gate voltages.

Aspect 18. A device, the device comprising a plurality of components according to any one of claims 1-17.

Aspect 19. A method, comprising applying a voltage to a component according to any one of Aspects 1-17.

Aspect 20. The method of Aspect 19, wherein the voltage switches the component from a persistent first state to a persistent second state.

Aspect 21. The method of any one of Aspects 19-20, wherein the voltage is less than about 5 V. As an example, the voltage can be from about 0.5 to about 5 V, or from about 0.5 to about 3.3 V, from about 0.5 to about 1.5 V, or even from about 0.5 to about 1 V.

Aspect 22. The method of any one of Aspects 19-21, wherein the voltage is in the range of from about 0.4 to about 5 V.

Aspect 23. A method, comprising: fabricating a component according to any one of Aspects 1-17, the fabricating being performed at less than about 400 deg. C. The fabrication can be performed at, e.g., less than about 400 deg C. less than about 390 deg. C., less than about 380 deg. C., less than about 370 deg. C., less than about 360 deg. C., or even less than about 350 deg. C. Without being bound to any particular theory, the unique materials and structure of the disclosed devices allows for fabrication at the relatively low temperatures characteristic of BEOL processes.

Aspect 24. The method of Aspect 23, wherein the AlScN portion is co-sputtered from separate Al and Sc targets or wherein the AlScN portion is sputtered from a single alloyed target. The foregoing techniques will be well-known to those of ordinary skill in the art.

Aspect 25. The method of any one of Aspects 23-24, comprising depositing one or more layers of the 2D material onto the AlScN portion.

Aspect 26. The method of any one of Aspects 23-25, further comprising depositing at least one of the source electrode and the drain electrode onto the channel portion.

What is claimed:

1. A component, comprising:
- a portion of AlScN that is 0001 or 0002-oriented crystal in form;
- a semiconducting channel portion,
  - the channel portion being in electronic communication with the portion of AlScN, and
  - the channel portion comprising a material characterized as a 2D semiconducting metal chalcogenide,
- a 111-oriented metal back-gate electrode contacting the portion of AlScN;
- a metallic source electrode in electronic communication with the channel portion; and
- a metallic drain electrode in electronic communication with the channel portion,
- the metallic source electrode being superposed over the semiconducting channel portion, and the semiconducting channel portion being superposed over the portion of AlScN such that the metallic source electrode is superposed over the portion of AlScN.

2. The component of claim 1, wherein the channel portion is disposed on the portion of AlScN.

3. The component of claim 1, wherein the channel portion is characterized as comprising a plurality of monolayers of the 2D semiconducting metal chalcogenide.

4. The component of claim 1, wherein the 2D semiconducting metal chalcogenide comprises $MoS_2$, $WS_2$, $WSe_2$, $MoTe_2$, InSe, SnSe, GaSe, CrGeTe, black phosphorus, tellurene, arsenene, selenene or any combination thereof.

5. The component of claim 1, wherein the portion of AlScN defines a thickness in the range of from about 2 to about 50 nm.

6. The component of claim 1, wherein the channel portion defines a thickness in the range of from about 0.5 to about 1.2 nm.

7. The component of claim 1, wherein the component exhibits a memory window/thickness in the range of from about 0.05 to about 0.4 V/nm.

8. The component of claim 1, wherein the component exhibits an on/off ratio of from about 10 to about 107.

9. The component of claim 1, wherein (a) the back-gate electrode contacts the AlScN portion, (b) the source electrode contacts the channel, (c) the drain electrode contacts the channel, or any combination of (a), (b), and (c).

10. The component of claim 1, wherein the component exhibits a counterclockwise hysteresis loop under a relatively larger gate voltage sweep of and a negligible hysteresis loop under a relatively smaller gate voltage sweep as compared to the relatively larger gate voltage sweep.

11. The component of claim 1, wherein the back-gate electrode has a thickness of from about 5 to about 200 nm, wherein the AlScN portion has a thickness of from about 5 nm to about 500 nm, wherein the semiconducting channel portion has a thickness of from about 0.5 to about 5 nm, wherein the source electrode has a thickness of from about 10 nm to about 100 nm, and wherein the drain electrode has a thickness of from about 10 nm to about 100 nm.

12. The component of claim 1, wherein either one or both of the source electrode and the drain electrode independently comprises Ti, Cr, Au, or Pd.

13. The component of claim 1, wherein the semiconducting character of the material corresponds to n-type.

14. The component of claim 1, wherein the semiconducting character of the material corresponds to ambipolar.

15. The component of claim 14, wherein the component is characterized as having two stable voltage-induced states at positive gate voltages, and wherein the component is characterized as having two stable voltage-induced states at negative gate voltages.

16. A method, comprising applying a voltage to a component according to claim 1.

17. The method of claim 16, wherein the voltage switches the component from a persistent first state to a persistent second state.

18. A method, comprising:

fabricating a component according to claim 1, the fabricating being performed at less than about 400 deg. C.

19. The component of claim 1, further comprising an oxide layer disposed between the portion of AlScN and the semiconducting channel portion.

20. The component of claim 1, wherein the 111-oriented metal back-gate electrode comprises Pt.

21. The component of claim 1, wherein the metallic drain electrode is superposed over the semiconducting channel portion, and the semiconducting channel portion is superposed over the portion of AlScN such that the metallic drain electrode is superposed over the portion of AlScN.

22. The component of claim 1, wherein the component is free from a depolarization capacitor for depolarizing the semiconductor channel.

23. The component of claim 1, wherein the portion of AlScN defines a thickness in the range of from about 2 to about 50 nm, wherein the channel portion defines a thickness in the range of from about 0.5 to about 1.2 nm, and wherein the 2D semiconducting metal chalcogenide comprises $MoS_2$, $WS_2$, $WSe_2$, $MoTe_2$, InSe, SnSe, GaSe, CrGeTe, black phosphorus, tellurene, arsenene, selenene or any combination thereof.

* * * * *